(12) United States Patent
Honda et al.

(10) Patent No.: US 7,250,616 B2
(45) Date of Patent: Jul. 31, 2007

(54) TEMPERATURE ADJUSTMENT APPARATUS, EXPOSURE APPARATUS HAVING THE SAME, AND DEVICE FABRICATING METHOD

(75) Inventors: Masanori Honda, Tochigi (JP); Yoshiki Kino, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 5 days.

(21) Appl. No.: 11/337,023

(22) Filed: Jan. 23, 2006

(65) Prior Publication Data
US 2006/0151724 A1 Jul. 13, 2006

Related U.S. Application Data

(63) Continuation of application No. 10/824,272, filed on Apr. 14, 2004, now Pat. No. 6,992,306.

(30) Foreign Application Priority Data
Apr. 15, 2003 (JP) ............... 2003-110209

(51) Int. Cl.
*G01J 3/10* (2006.01)
(52) U.S. Cl. ............... 250/492.2; 62/3.7; 62/259.2; 359/820; 165/289
(58) Field of Classification Search ............... None
See application file for complete search history.

(56) References Cited

U.S. PATENT DOCUMENTS 5,448,612 A 9/1995 Kasumi et al.
5,572,563 A 11/1996 Kasumi et al.
5,813,233 A 9/1998 Okuda et al.
5,975,709 A 11/1999 Ebinuma et al.
6,043,863 A 3/2000 Ikeda
6,359,678 B1 3/2002 Ota
6,377,655 B1 4/2002 Murakami et al.
6,549,270 B1 4/2003 Ota
6,856,475 B2 2/2005 Nasu et al.
7,155,915 B2 * 1/2007 Shin et al. ............... 62/3.7
2002/0041368 A1 4/2002 Ota et al.
2003/0063375 A1 4/2003 Suzuki et al.
2004/0035570 A1 2/2004 Hara

FOREIGN PATENT DOCUMENTS

| JP | 05-100096 | 4/1993 |
|---|---|---|
| JP | 07-072318 | 3/1995 |
| JP | 07-174896 | 7/1995 |
| JP | 08-068897 | 3/1996 |
| JP | 08-068898 | 3/1996 |
| JP | 08-211210 | 8/1996 |
| JP | 08-211211 | 8/1996 |
| JP | 10-144602 | 5/1998 |

(Continued)

*Primary Examiner*—Nikita Wells
*Assistant Examiner*—Zia R. Hashmi
(74) *Attorney, Agent, or Firm*—Morgan & Finnegan, L.L.P.

(57) ABSTRACT

A temperature adjustment apparatus for adjusting the temperature of an optical member includes a first radiation mechanism, with a first radiation member, that transfers the radiation heat between a predetermined area of the optical member and for adjusting the temperature of the optical member by the first radiation member; and a shielding member for reducing radiation heat transferred to an area other than the determined area among the radiation heat from the first radiation member.

14 Claims, 19 Drawing Sheets

FOREIGN PATENT DOCUMENTS

| | | |
|---|---|---|
| JP | 10-339799 | 12/1998 |
| JP | 11-166691 | 6/1999 |
| JP | 11-219900 | 8/1999 |
| JP | 11-243052 | 9/1999 |
| JP | 11-326598 | 11/1999 |
| JP | 11-329918 | 11/1999 |
| JP | 11-345760 | 12/1999 |
| JP | 2000-098092 | 4/2000 |
| JP | 2000-100697 | 4/2000 |
| JP | 2000-286189 | 10/2000 |
| JP | 2000-349009 | 12/2000 |
| JP | 2001-215105 | 8/2001 |
| JP | 2001-241929 | 9/2001 |
| JP | 2001-280931 | 10/2001 |
| JP | 2002-190438 | 7/2002 |
| JP | 2003-045782 | 2/2003 |
| JP | 2003-058254 | 2/2003 |

* cited by examiner

PRIOR ART

TEMPERATURE ADJUSTMENT APPARATUS, EXPOSURE APPARATUS HAVING THE SAME, AND DEVICE FABRICATING METHOD

This application is a continuation application of U.S. patent application Ser. No. 10/824,272, filed on Apr. 14, 2004 now U.S. Pat. No. 6,992,306, entitled "Temperature Adjustment Apparatus, Exposure Apparatus Having The Same, And Device Fabricating Method". Aforementioned U.S. patent application Ser. No. 10/824,272, filed on Apr. 14, 2004, is hereby incorporated by reference herein in its entirety.

This application claims the right of priority under 35 U.S.C. § 119 to Japanese Patent Application No. 2003-110209, filed on Apr. 15, 2003, in Japan. Aforementioned Japanese Patent Application No. 2003-110209, filed on Apr. 15, 2003, is hereby incorporated by reference herein in its entirety.

BACKGROUND OF THE INVENTION

The present invention relates generally to cooling apparatuses, and more particularly to a cooling apparatus for cooling an optical element used in an exposure apparatus that exposes an object such as a single crystal substrate for a semiconductor wafer (plate or ball) or a glass plate (wafer) for a liquid crystal display (LCD). The present invention is particularly suitable, for example, for an exposure apparatus that uses ultraviolet light and/or extreme ultraviolet ("EUV") light as a light source for exposure.

Conventionally, during manufacturing, photolithography technology, a reduction projection exposure apparatus using a projection optical system to project a circuit pattern formed on a mask (reticle) onto a wafer, etc., has been employed for transferring the circuit pattern of fine semiconductor devices such as semiconductor memory and logic circuit.

The minimum critical dimension transferred by the projection exposure apparatus or resolution is proportionate to the wavelength of light used for exposure and inversely proportionate to the numerical aperture ("NA") of the projection optical system. The shorter the wavelength is, the better the resolution. Thus, along with recent demands for finer semiconductor devices, shorter ultraviolet light wavelengths have been proposed—from an ultra-high pressure mercury lamp (I-line with a wavelength of approximately 365 nm) to KrF excimer laser (with a wavelength of approximately 248 nm) and ArF excimer laser (with a wavelength of approximately 193 nm).

However, lithography using ultraviolet light has limitations when it comes to satisfying the rapidly promoted fine processing of a semiconductor device according to Moore's Law. Therefore, a reduction projection optical system using extreme ultraviolet ("EUV") light with a wavelength of 10 to 15 nm shorter than that of the ultraviolet (referred to as an "EUV exposure apparatus" hereinafter) has been developed to efficiently transfer very fine circuit patterns of 100 nm or less.

However, because the light absorption in a material increases remarkably as the wavelength of the exposure light becomes shorter, it is difficult to use refraction elements or lens used for visible and ultraviolet light. In addition, no glass material exists for the EUV light's wavelength range. Therefore, reflection-type or catadioptric optical system uses only a reflective element or mirror.

However, the mirror does not reflect all the exposure light, but absorbs about 30% or more. The absorbed exposure light causes residual heat, which deforms the surface shape of the mirror and deteriorates its optical performance, particularly the imaging performance. Therefore, to reduce the mirror's shape change as the temperature changes, the mirror should be made of a low thermal expansion glass, for example, one having a coefficient of linear expansion of 10 ppb.

The EUV exposure apparatus is used for exposure of a circuit pattern of 0.1 μm and has strict critical dimension accuracy requirements. Therefore, the mirror's surface shape is permitted to deform only about 0.1 nm or less. As a result, even a gradual temperature rise on a mirror with a coefficient of linear expansion of 10 ppb would cause the mirror's surface shape to change. For example, a mirror with a thickness of 50 mm has a surface shape change of about 0.1 nm when the temperature rises by 0.2° C. So, for accuracy, the mirror used by an EUV exposure apparatus should keep constant temperature.

However, because the EUV exposure apparatus maintains vacuum atmosphere for an exposure optical path, for example, about $1 \times 10^{-6}$ [Pa], so that reaction between the residual gas component in the exposure optical path, such as polymer organic gas, and EUV light does not contaminate the mirror's surface and cause lower reflectance; a heat transfer means to cool the mirror cannot use convection heating such as spraying a gas. It can only perform heat transfer by heat transmission or radiation heat transfer.

The heat conductivity, in general, is very low in the low thermal expansion glass that makes up the mirror. For example, the heat conductivity of the ZERODUR of Shott Co. is 1.6[W/mK]. Therefore, disparate temperature distribution results in the mirror because the mirror cannot properly conduct the absorbed heat to the entire mirror. The disparate temperature distribution causes local deformities (thermal expansion) in the mirror and deteriorates its optical performance. Therefore, in the EUV exposure apparatus, it is necessary to maintain a uniform mirror temperature to avoid generating disparate temperature distribution in the mirror.

FIG. 19 is a schematic structure of a mirror cooling apparatus for using liquid or air as a cooling medium. FIG. 19A is a lower view of the cooling apparatus, whereas FIG. 19B is a side view of the cooling apparatus. In FIG. 19, 1001 is a mirror made of the low thermal expansion glass with low heat conductivity. 1002 is a water pipe for moving water as a cooling medium. 1003 is a joint that connects the water pipe 1002 to a channel 1004 which will be described later. 1004 is the channel for moving the cooling medium into the water pipe 1002. The water pipe 1002 is in contact with a back side of the mirror. The cooling apparatus, by moving the cooling medium into the water pipe 1002, cools the mirror 1001 through heat transfer. As a result, temperature rises on the mirror 1001 can be controlled.

Japanese Laid-Open Patent Application No. 2002-190438 discloses a method of decreasing influence from a heat source. An exposure apparatus exposes a pattern of a mask to a substrate by using a processing part and alignment sensor that processes it, and processing the exposure to a projection optical system. The exposure apparatus comprises a block part that blocks propagation of radiation heat generated from the processing part. Also, Japanese Laid-Open Patent Application No. 05-100096, Japanese Laid-Open Patent Application No. 07-072318, Japanese Laid-Open Patent Application No. 07-174896, Japanese Laid-Open Patent Application No. 08-068897, Japanese Laid-Open Patent Application No. 08-068898, Japanese Laid- Open Patent Application No. 08-211210, Japanese Laid-Open Patent Application No. 08-211211, Japanese Laid-Open Patent Application No. 10-144602, Japanese Laid-Open Patent Application No. 10-339799, Japanese Laid-Open Patent Application No. 11-166691, Japanese Laid-Open Patent Application No. 11-219900, Japanese Laid-Open Patent Application No. 11-243052, Japanese Laid-Open Patent Application No. 11-326598, Japanese Laid-Open Patent Application No. 11-329918, Japanese Laid-Open Patent Application No. 11-345760, Japanese Laid-Open Patent Application No. 2000-098092, Japanese Laid-Open Patent Application No. 2000-100697, Japanese Laid-Open Patent Application No. 2000-286189, Japanese Laid-Open Patent Application No. 2000-349009, Japanese Laid-Open Patent Application No. 2001-215105, Japanese Laid-Open Patent Application No. 2001-241929, Japanese Laid-Open Patent Application No. 2001-280931 and Japanese Laid-Open Patent Application No. 2003-058254 disclose a method for cooling an optical element, in particular, the mirror. However, because it cools the mirror through contact with the mirror, vibrations from the cooling medium's flow through the mirror is transmitted to the mirror, deteriorating the optical performance. Also, because it cools the mirror from the back side, the cooling performance on the mirror is bad. This causes the temperature of the mirror to rise and deform the reflection plane.

The conventional cooling mechanism as described in FIG. 19 cannot completely absorb heat that incidents from an exposure plane of the mirror because it cools the mirror from the back, where heat conductivity is low. Therefore, the heat deforms the mirror, preventing achievement of the intended optical performance.

Also, Japanese Laid-Open Patent Application No. 2002-190438 with only the block part cannot adjust the temperature of the optical element of the projection optical system with high accuracy, causing fear that disparate temperature distribution may occur in the optical element.

In such a case, the cooling medium is directly connected to the mirror's surface and cools as shown in Japanese Laid-Open Patent Application No. 11-243052, Japanese Laid-Open Patent Application No. 2000-286189, Japanese Laid-Open Patent Application No. 2000-349009, Japanese Laid-Open Patent Application No. 2001-215105, Japanese Laid-Open Patent Application No. 2001-241929 and Japanese Laid-Open Patent Application No. 2001-280931. However, the low frequency vibration caused by the flow of the cooling medium to the reflection plane of the mirror is transmitted to the mirror, causing unacceptable influences to the optical performance of the mirror.

BRIEF SUMMARY OF THE INVENTION

Accordingly, it is an exemplary object of the present invention to provide a cooling apparatus and method, and an exposure apparatus having the cooling apparatus, which can keep the temperature of an optical member constant without generating disparate temperature distribution in the optical member and preventing deterioration in imaging performance.

A temperature adjustment apparatus of one aspect of the present invention for adjusting the temperature of an optical member, includes a first radiation mechanism with a first radiation member that transfers the radiation heat between a predetermined area of the optical member, an adjusting member for adjusting the temperature of the optical member with the first radiation member, and a shielding member for reducing the amount of radiation heat transferred to an area other than the determined area among the radiation heat from the first radiation member.

An exposure apparatus of another aspect of the present invention includes an optical system with an optical member that leads light from a light source to an object, a first radiation mechanism with a first radiation member that transfers the radiation heat between a predetermined area of the optical member, an adjusting member for adjusting the temperature of the optical member by the first radiation member, and a shielding member for reducing the amount of radiation heat transferred to an area other than the determined area among the radiation heat from the first radiation member.

A stop apparatus of another aspect of the present invention includes a stop, arranged at an incidence side of an optical member, for limiting incidence light to the optical member. The emissivity of the stop is less than 0.1 or more than 0.9.

An exposure apparatus of another aspect of the present invention includes an optical system with an optical member that leads light from a light source to an object and a stop arranged at an incidence side of the optical member for limiting incidence light to the optical member. The emissivity of the stop is less than 0.1 or more than 0.9.

An exposure apparatus of another aspect of the present invention includes an optical system with an optical member that leads light from a light source to an object, a first radiation mechanism with a first radiation member that transfers the radiation heat between a predetermined area of the optical member, an adjusting member for adjusting the temperature of the optical member by the first radiation member, a shielding member for reducing the amount of radiation heat transferred to an area other than the area among the radiation heat from the first radiation member, a temperature detector mechanism for detecting the temperature of the optical member, and a controller mechanism for controlling the first radiation mechanism based on the detection result from the temperature detector mechanism.

A device fabrication method of another aspect of the present invention includes the steps of exposing an object using an exposure apparatus and performing a development process on the object exposed. The exposure apparatus includes an optical system with an optical member that leads light from a light source to an object, a first radiation mechanism with a first radiation member that transfers the radiation heat between a predetermined area of the optical member, an adjusting member for adjusting the temperature of the optical member by the first radiation member, a shielding member for reducing the amount of radiation heat transferred to areas other than the determined area among the radiation heat from the first radiation member, a temperature detector mechanism for detecting the temperature of the optical member, and a controller mechanism for controlling the first radiation mechanism based on the detection result by the temperature detector mechanism.

Other objects and further features of the present invention will become readily apparent from the following description of the preferred embodiments with reference to the accompanying drawings.

BRIEF DESCRIPTION OF THE DRAWINGS

FIG. 19 is a view of a conventional mirror cooling apparatus, wherein

DETAILED DESCRIPTION OF THE PREFERRED EMBODIMENTS

Figure 1:
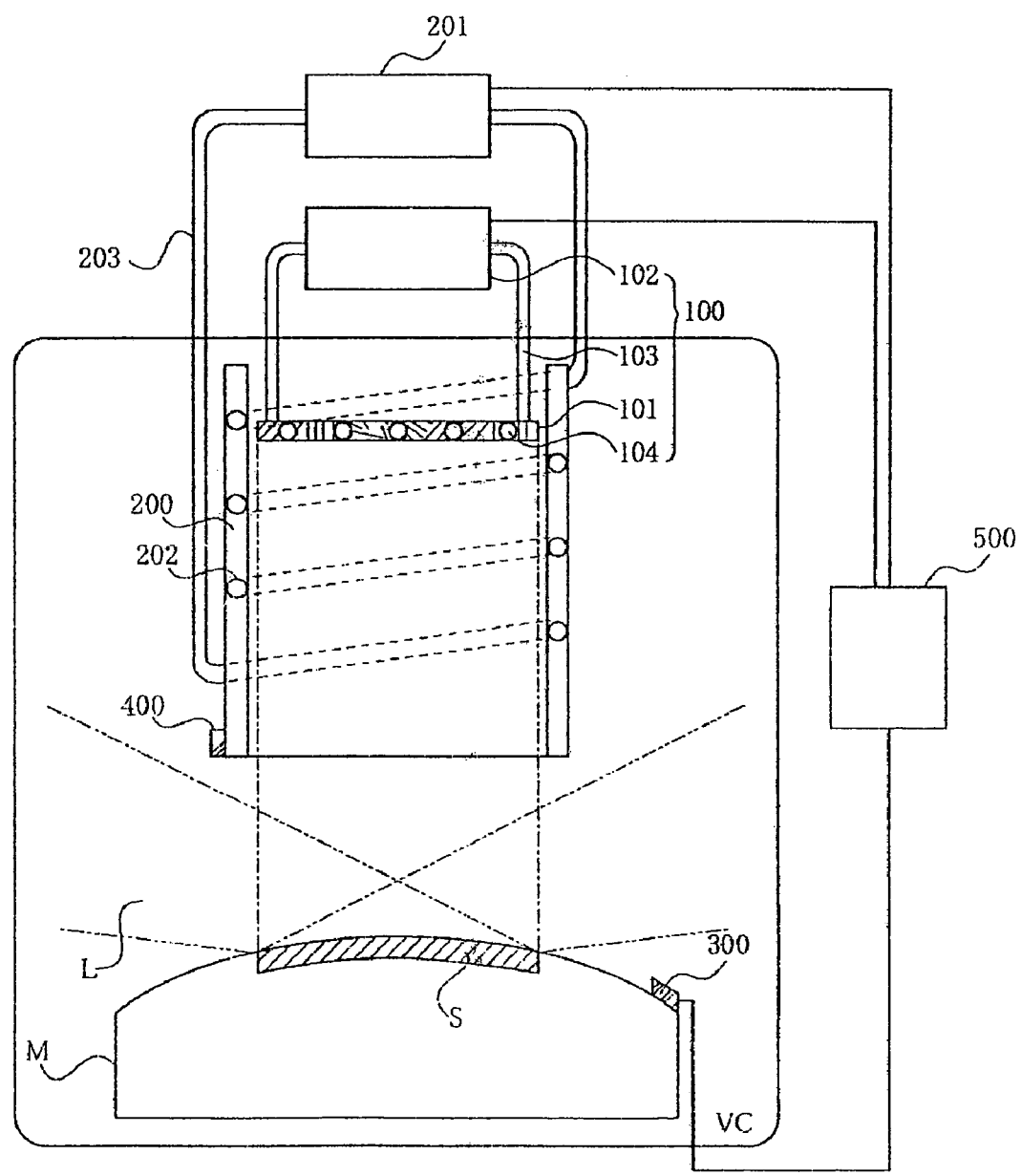
FIG. 1 is a block diagram of a cooling apparatus of one aspect according to the present invention.

With reference to the accompanying drawings, a description will now be given of a cooling apparatus and method of one embodiment according to the present invention. In each figure, the same reference numeral denotes the same element. Therefore, duplicate descriptions will be omitted.

Here, FIG. 1 is a schematic structure of a cooling apparatus 1 according to the present invention. The cooling apparatus 1 is for cooling an optical member M in a vacuum chamber VC. The vacuum chamber VC is maintained at high vacuum, for example, about $1 \times 10^{-6}$ [Pa], by a vacuum pump (not shown) so that a reaction between the residual gas component in the exposure optical path and exposure light L does not contaminate the mirror's surface and lower its reflectance. The optical member M is located at a predetermined position via an optical-member support member (not shown) that is supported by an optical-member support stool (not shown) in the vacuum chamber VC. It images light using reflection, refraction, diffraction, etc. The optical element M includes, for example, a mirror, a lens, a parallel plate glass, a prism, a Fresnel zone plate, a kinoform, a binary optics, a hologram, and other diffraction optical elements. The instant embodiment describes the optical member as a mirror. The cooling apparatus 1 includes, as shown in FIG. 1, a radiation cooling mechanism (a radiation temperature adjustment mechanism) 100, a hood (a radiation heat shielding member) 200, an optical member temperature detector 300, a hood temperature detector 400, and a controller 500. Here, the hood is cylindrical form, however, other column forms, such as triangular and square pole, etc, are acceptable. The "radiation" is, a transfer of radiation heat between two members, a first member and second member. The radiation heat is transmitted from the first member to the second member or the radiation is transmitted from the second member to the first member. As a result, one side is cooled because of the difference in heat value of the radiation heat transmitted while the other member is heated. In the instant example, heating and cooling through the transfer of the radiation heat is transferred from one side to the other side (even heating and cooling).

The radiation cooling mechanism 100 is provided at a position opposite to and apart from the exposure plane of the optical member M. It absorbs the heat from exposure area S (area of the optical member that is irradiated to light) of the optical member M through radiation (heat is only absorbed from the optical material through the differences in the heat given by the radiation). In other words, the radiation cooling mechanism 100 cools only the exposure area that has a high temperature due to exposure to radiation. The radiation cooling mechanism 100 includes a radiation plate 101, circulation part 102, pipe 103, and a channel 104. The exposure area mentioned here is more than half the light intensity area at the position where light intensity is the highest in the exposure area or light with light volume of 30% or more are irradiated.

The radiation plate 101 is separated by a constant distance from the optical member M, so as not to block the exposure light path, is supported by a radiation-plate support member (not shown) attached to a radiation-plate support stool (not shown). The radiation-plate support stool and member are generally made of lightweight and high rigidity ceramics with a small coefficient of linear expansion. Since the optical-member support stool (not shown) is structurally separated from the radiation-plate support stool, the vibrations of the radiation plate 101 and radiation-plate support stool are prevented from transmitting to the optical member M when cooling medium flows through the channel 104 formed in the radiation plate 101. Therefore, the optical member M does not deform its surface shape due to the vibration and may acheive the desired optical performance.

A shape of the radiation plate 101, in providing a light path for the exposure light, has a mode coefficient that is an important parameter for deciding radiation heat transfer volume (the higher the mode coefficient is, the bigger the radiation heat transfer volume is) from exposure area S of the optical member M where the mode coefficient is the highest. The radiation plate 101 is formed to radiation cool only exposure area S. Also, the radiation plate 101 has the channel 104 for the cooling medium, supplied by the circulation part 102 (described later), to flow through. The channel 104 is connected to the circulation part 102 through a pipe 103. The channel 104 is formed over the entire surface of the radiation plate 101. The cooling medium is adjusted to flow uniformly over the entire surface of the radiation plate 101. The radiation plate 101, cooled by the cooling medium, has a low temperature which forms a temperature difference relative to the exposure area S of the optical member M. The radiation plate 101 absorbs the incidence heat to the exposure area S of the optical member M due to the temperature difference with the exposure area S of the optical element M. The radiation plate 101 is made of a material having comparatively good heat conductivity and high emissivity, such as aluminum nitride of ceramics (AlN). A material with higher heat conductivity or with heat conductivity of 90% or more of the heat conductivity of aluminum nitride ceramics can be used.

The circulation part 102 is connected to a pipe 103. It supplies and circulates to the channel 104 the cooling medium via the pipe 103. The circulation part 102, controlled by the controller 500 (which will be described later), changes the cooling medium's temperature. The cooling medium flows through the channel 104 formed in the radiation plate 101 and cools the radiation plate 101. The temperature of the cooling medium determines the amount of cooling to the radiation plate 101. The instant embodiment supplies and circulates the cooling medium as water (liquid), but may use gas. Here, the cooling medium may be heated or cooled depending on the temperature changes of the radiation plate 101. Desirably, the cooling medium, accumulated beforehand, is at two or more mutually different temperature. It is then adjusted to the required temperature by mixing them according to the target temperature of the radiation plate.

The hood 200 is located at the radiation shielding member to prevent the radiation plate 101 from cooling outside the exposure area S of the optical member M. The hood 200 is supported by a hood support member (not shown) and encloses the side of the radiation plate 101. The emissivity of the internal surface of the hood 200 is improved by a surface treatment. (Here, the emissivity is more than 0.8, desirably, more than 0.9). Therefore, a heat ray that is emitted from a plane excluding the exposure area S of the optical member M and incidents from the opening part of the hood 200 is absorbed by the internal surface of the hood 200 and does not reach the radiation plate 101. The hood 200 is made of a material having comparatively good heat conductivity and high emissivity, such as aluminum nitride ceramics (AlN) or a material with heat conductivity of 90% or more of the heat conductivity of aluminum nitride ceramics. Here, because the only object cooled by the radiation is the exposure area S, the radiation shielding member has been located to prevent cooling of areas outside the exposure area S. However, the cooling object is not limited to the exposure area S and areas including the exposure area S or areas outside the exposure area S are acceptable.

In the instant embodiment, the hood 200 covers the entire side of the radiation plate (radiation member) 101 and the optical member. It is located to cover the entire side of the space that the optical member exposes to the radiation plate (it may be acceptable that the optical member and the radiation plate are parallel or the normal of each other is inclined) 101. However, it is not necessary that the hood covers the entire side of the space that the optical member exposes to the radiation plate because a structure may lack a part and/or all around covering is not possible.

The hood 200 has a channel 202 for the cooling medium supplied by the circulation part 201, which will be described later, to flow through. The channel 202 is connected to the circulation part 201 through a pipe 203. The channel 202 is formed over the entire surface of the hood 200. The cooling medium is adjusted to flow uniformly over the entire surface of the hood 200. The hood 200 is cooled or heated by the cooling medium's flow through the channel 202. Its temperature is maintained at a value equal to the temperature of the optical member M (or a target temperature of the optical member, or a target temperature of the member that supports the optical member, desirably, in a range of 23.5° C. to 24.5° C.). In other words, the optical member M and hood 200 does not transfer the heat through the radiation and the optical member M is not heated or cooled by the hood 200.

Therefore, the cooling apparatus 1 can cool only the exposure area S of the optical member M by radiation from the radiation plate 101.

Here, the temperature of the hood 200 is adjusted to become equivalent to the target temperature of the optical member. If the optical member's temperature shifts to the target temperature (it is the same as the temperature of the hood 200), heat is exchanged between the hood and the optical member. However, only the radiation plate 101 substantially cools the optical member M (exchange heat from the optical member M) because the heat transfer between the optical member M and the hood is small (with in 2° C., desirably within 0.5° C.). The temperature fluctuation is small (with in 2° C., desirably within 0.5° C.) even when there is fluctuation between the temperature of the optical member M and the hood 200, when the temperature of the hood 200 is adjusted to the target temperature of the optical member and the support member of the optical member etc. Therefore, only the radiation plate 101 substantially cools the optical member M (exchange heat from the optical member M) because the heat volume transferred between the optical member M and the hood 200 is very little.

The circulation part 201 is connected to a pipe 203. Cooling medium is supplied and circulated through the channel 202 via the pipe 203. The circulation part 201 is controlled by the controller 500 (described later), which changes the temperature of fluid. The fluid flows through the channel 202 to cool or heat the hood 200. The temperature of the fluid determines the temperature of the hood 200. The instant embodiment supplies and circulates water (or liquid) as the cooling medium, but may use gas.

The optical member temperature detector 300, attached to the optical member M outside the illumination area where the exposure light L is irradiated, detects the temperature of the optical member M. The optical member temperature detector 300 sends the detected temperature of the optical member M to the controller 500 (which will be described later). The optical member temperature detector 300 includes a temperature sensor such as a thermocouple, a resistor temperature sensor, and an infrared temperature sensor. While the optical member temperature detector 300 is attached or contacts the optical member M in the instant embodiment, the optical member temperature detector 300 may be unattached to the optical member M for detecting the temperature of the optical member M. When the optical member temperature detector 300 is provided unattached to the optical member M, parts of the temperatures detected in the exposure area S (irradiation area of the exposure light) and areas excluding the exposure area S is acceptable.

Sometimes there is a difference between the temperature detected by the optical member temperature detector 300 and the average temperature of the exposure area S of the optical member M when the optical member M has a temperature distribution. In this case, the (average) temperature of the exposure area S of the optical member M may be inferred based on the temperature detected by the optical member temperature detector 300 singularly or in combination with the temperature inside the chamber VC detected by a thermometer or temperature detector means (not shown). Cooling may be controlled based on the inferred temperature.

The hood temperature detector 400 contacts the surface of the hood 200 and detects the temperature. The hood temperature detector 400 includes a temperature sensor such as a thermocouple, a resistor temperature sensor, and an infrared temperature sensor. The hood temperature detector 400 sends the detected temperature of the hood 200 to the controller 500 (which will be described later). While the hood temperature detector 400 is attached or contacts the hood 200 in the instant embodiment, the hood temperature detector 400 may be unattached to the hood 200 to detect the temperature of the hood 200. In the instant embodiment, the hood temperature detector 400 contacts the outside of the hood 200 and arrangements, and detects the outside of the hood 200. However, the hood temperature detector 400 may contact the inside of the hood 200 and arrangements, and may detect the temperature of a predetermined area (point) on the inside of the hood.

The controller 500 controls the radiation cooling mechanism 100 so that the temperature of the exposure plane of the optical member M, detected by the optical member temperature detector 300, may have the predetermined value. More specifically, the controller 500 controls the temperature of the radiation plate 101 by changing the temperature of the cooling medium to be supplied and circulated through (the channel 104 in) the radiation plate 101. This control adjusts the amount of heat absorbed by the optical member M and maintains the temperature of the optical member M to the predetermined value. In other words, the controller 500 serves to maintain a constant temperature at the exposure area S of the optical member M. Here, the controller 500 may determine the temperature of the radiation plate 101A and the voltage applied to the Peltier element based on the optical member temperature detector 300, the light volume of incidence light in the exposure area S or optical member M and the distribution etc. For example, when the cooling apparatus of the instant embodiment is applied to the projection optical system of the exposure apparatus, it is desirable to control the radiation cooling mechanism (the temperature of the radiation plate is controlled) according to the temperature detection result of the optical element (mirror, lens, diffraction optical element) in the projection optical system, the exposure schedule (the light volume of the light emitted from the light source, number of pulses and the pattern of the reticle etc.), and the light volume distribution in the optical element.

Also, the controller 500 changes the temperature of the cooling medium to be supplied and circulated through (the channel 202 in) the hood 200 so that the temperature of the hood 200 detected by the hood temperature detector 400 may be substantially equal to (an error margin within 2° C., more preferably within 0.5° C.) the temperature of the optical member M detected by the optical member temperature detector 300 (or the target temperature of the optical member, or the target temperature of the member supports the optical member). With this control, the hood 200 does not heat or cool the optical member M because the temperature of the hood 200 is equal to the temperature of the optical member M.

Figure 2:
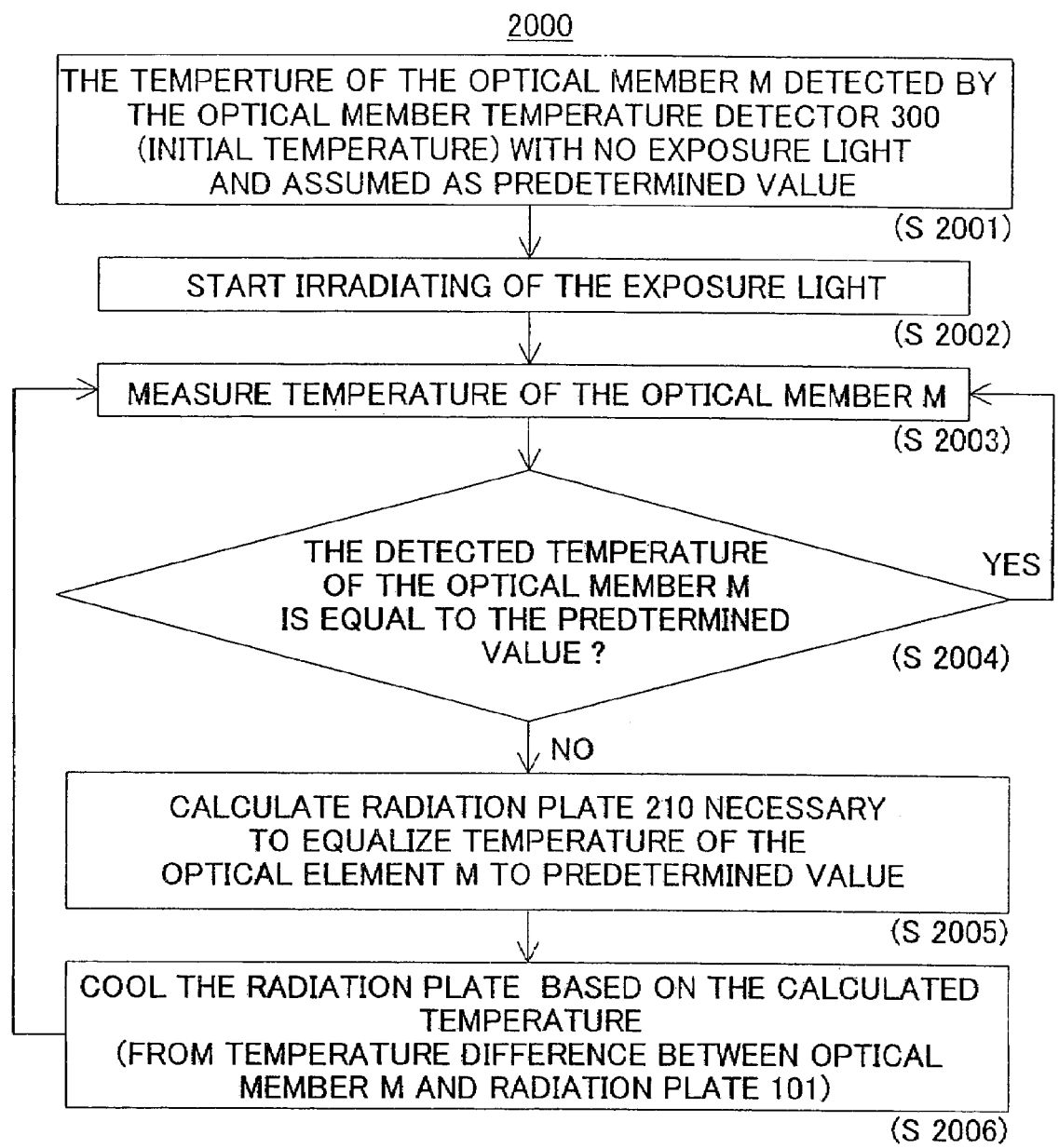
FIG. 2 is a flowchart for explaining a cooling method for cooling an optical member in vacuum atmosphere.

With reference to FIG. 2, a description will now be given of the cooling method 2000 for the optical member M using the cooling apparatus 1. FIG. 2 is a flowchart for explaining the cooling method 2000 for cooling the optical member M in vacuum atmosphere.

The hood's 200 temperature, controlled by the controller 500, is equal to the optical member M, so does not heat or cool the optical member M.

The optical member temperature detector 300 detects the temperature of the optical member M at the initial state or when the exposure light L is not irradiated onto the optical member M, and sends the detected initial temperature to the controller 500. The controller 500 records the received initial temperature of the optical member M as the predetermined value (step 2001). It is assumed that the surface shape of the optical member M does not change in the initial state. When the exposure light L is irradiated onto the optical member M (step 2002), the optical member temperature detector 300 detects the temperature of the optical member M (step 2003). It is then determined to see whether the temperature of the optical member M detected by the optical member temperature detector 300 is equal to the predetermined value (step 2004). When the detected temperature of the optical member M is equal to the predetermined value, the procedure from step 2003 is repeated while exposure light L is irradiated onto the optical member M. If the detected temperature of the optical member M is different from the predetermined value, the controller 500 calculates the temperature of the radiation plate 101 required to enable the temperature of the optical member M to be equal to the predetermined value (step 2005). The controller 500 adjusts the temperature of the cooling medium, circulated and supplied by the circulation part 102, based on the calculated temperature of the radiation plate 101, to cool the radiation plate 101 (step 2006). Step 2006 thus forms a temperature difference between the exposure area S of the optical member M and the radiation plate 101. Therefore, the radiation plate 101 absorbs the heat from the optical member M through radiation and maintains the temperature of the optical member M at the predetermined value. The procedure in step 2003 is repeated while the exposure light L is irradiated onto the optical member M.

Therefore, the cooling apparatus 1 and the cooling method 2000 can efficiently absorb an input heat by only cooling the exposure area S where input heat is generated by the exposure of the optical member M, which is composed low thermal conductivity material, in the vacuum atmosphere. As a result, the cooling apparatus 1 and the cooling method 2000 can maintain a constant temperature for the optical member M in a non-contact manner and achieve the desired optical performance by reducing deformation of the optical element due to thermal expansion, which would otherwise deteriorate imaging performance.

It is not necessary that step 2001 in the flowchart shown in FIG. 2 sets the initial temperature of the optical member to a predetermined value. The predetermined value may be the designed shape temperature of the optical member M. For example, if it is known that the optical member M has a designed shape at a temperature of 23 [° C.], the predetermined value is set to be 23 [° C.]. Of course, this value depends upon the apparatus, but preferably it is between 22 [° C.] to 24 [°C.].

Figure 3:
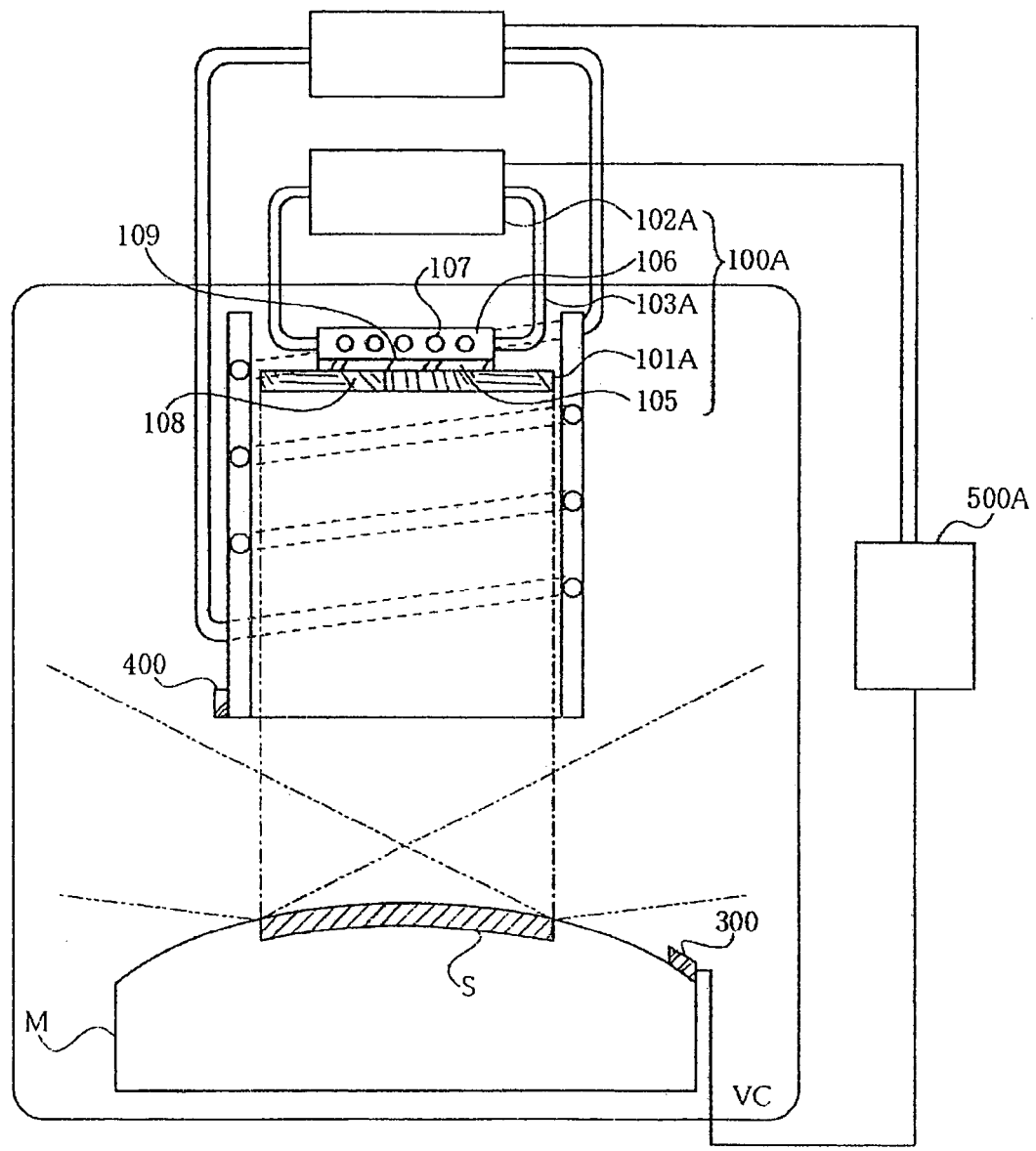
FIG. 3 is a block diagram of a cooling apparatus of one aspect according to the present invention.

A description will be given of a cooling apparatus 1A as a variation of the cooling apparatus 1 with reference to FIG. 3. The cooling apparatus 1A is different from the cooling apparatus 1 because of radiation cooling mechanism 100A and controller 500A. Additionally, the part not described in detail is similar to cooling apparatus 1 of FIG. 1.

Similar to cooling apparatus 1, cooling apparatus 1A is for cooling an optical member M in a vacuum chamber VC that is maintained at high vacuum, for example, about $1\times10^{-6}$ [Pa] by a vacuum pump (not shown). The instant embodiment describes the optical member M as a mirror. The cooling apparatus 1A includes, as shown in FIG. 3, a radiation cooling mechanism 100A, a hood 200, an optical member temperature detector 300, a hood temperature detector 400 and a controller 500A. (Though described and explained in FIG. 1, the exposure area S here, that is the area that light irradiates on excluding the exposure area S, is the cooled object, does not cool as much as possible. However, when the exposure area S is not the only cooled object, in other words, when the cooling area includes the exposure area S and a part of the exposure area S, the radiation cooling mechanism 100A is not composed only for cooling the exposure area S through the radiation.)

The radiation cooling mechanism 100A is provided at a position opposite to and apart from an exposure plane of the optical member M. It absorbs heat from the exposure area S of the optical member M through radiation. In other words, the radiation cooling mechanism 100A cools only the exposure area with high temperature due to exposure to radiation. The radiation cooling mechanism 100A includes a radiation plate 101A, a circulation part 102A, a pipe 103A, a Peltier element 105, a radiator block 106, and a channel 107.

In excluding a space where the exposure light form, the radiation plate 101A is fixed apart at a constant interval from the optical member M by a radiation-plate support member (not shown) supported by a radiation-plate support stool (not shown). The radiation plate 101A, coupled to and is cooled by the Peltier effect of the Peltier element 105, enters a lower temperature to form a temperature difference with the exposure area S of the optical member M. In other words, due to the temperature difference, the radiation plate 101A absorbs the heat from the exposure area S of the optical member M. The radiation plate 101A and the Peltier element 105 are joined to each other using metallization, such as soldering, which has small amounts of emission gas and good thermal conductivity, rather than adhesives which causes emission gas and contaminate the surface of the optical member M. Of course other resin based adhesives may be used. However, it is desirable that the adhesive have few emission gases.

The radiation plate 101A is made of a material having comparatively good heat conductivity and high emissivity, such as aluminum nitride ceramics (AlN). A material with high heat conductivity, or even if heat conductivity is bad, a material with heat conductivity of 90% or more of the heat conductivity of aluminum nitride ceramics can also be used. A shape of the radiation plate 101A, with a mode coefficient parameter that is important for deciding the radiation heat transfer volume from the exposure area S of the optical member M, where the heat is the highest, is formed to radiation cool only the exposure area S. Therefore, the radiation plate 101A can cool only the exposure area S of the optical member M through the radiation.

The Peltier element 105 arranges, for example, a p-type semiconductor and an n-type semiconductor thermally parallel to each other. The Peltier element 105 is controlled by the controller 500A (which will be described later) and coupled with the radiation plate 101A to cool the radiation plate 101A using a Peltier effect. The "Peltier effect" is a phenomenon in which the heat transfers due to a difference in electric conductivity when the current flows through two types of contacts of conductors or semiconductors. The instant embodiment makes the Peltier element 105 of a p-type semiconductor and an n-type semiconductor. Electrons have difficulty flowing on an area from the p-type semiconductor to the n-type semiconductor, thus forming a heat absorption surface 108. However, electrons can easily flow through an area from the n-type semiconductor to the p-type semiconductor, thus forming a heat radiation surface 109. Therefore, a joint of the heat radiation surface 109 of the Peltier element 105 with the radiation plate 101A would absorb the heat from the radiation plate 101A and cool the radiation plate 101A. The heat value which the Peltier element 105 may absorb is adjustable by applied voltage. The Peltier element 105 being highly responsive, precisely controls the temperature of the radiation plate 105 and maintains the temperature of the optical member M to a predetermined value. The radiator block 106 is coupled with the heat radiation surface 109 of the Peltier element 105.

The radiator block 106 is coupled with the heat radiation surface 109 of the Peltier element 105 with a metal, which reduces the amount of emission gas and improves the thermal conductivity. The radiator block 106 includes a channel 107 for the cooling medium, supplied by circulation part 102A (described later), to flow through. The channel 107 is connected to the circulation part 102A through the pipe 103A. The channel 107, formed over the entire surface of the radiator block 10-6, enables the cooling medium to flow through the entire surface in the radiator block 10-6. The heat absorbed by the optical member M via the radiation plate 101A is collected by radiator block 10-6 and cooled by the cooling medium. It is then exhausted from the heat radiation surface 109 of the Peltier element 105. The radiator block 10-6 is made of, for example, aluminum nitride ceramics (AlN).

The circulation part 102A, connected to a pipe 103A, supplies and circulates the cooling medium through the channel 107 in the radiator block 10-6 via the pipe 103A. The cooling medium, supplied and circulated by the circulation part 102A through the channel 107, collects the heat from the radiator block 10-6 to maintain an almost constant temperature in the radiator block. (The target temperature of the optical member should be within±1° C. More desirably, within 0.5° C. In other words, a temperature change within 2° C., more desirably, within 1° C.). Therefore, it is unnecessary to make the temperature of the cooling medium variable or remarkably low. For example, the cooling medium may have a temperature of 23° C. when attempting to maintain the temperature of the optical member M at 23° C. In other words, the circulation part 102A may supply and circulate the cooling medium at a certain temperature, which for example, is the temperature of the optical member M to be controlled. This prevents the optical performance of the optical member, such as the laser-interferometer fixing member and optical-member support member, from deteriorating by keeping the pipe 103A from changing its temperature during circulation, the optical member M from offsetting its position, and a member from cooling. The cooling medium flow into the channel 107 may use a cooling medium that has the same temperature as the cooling medium flow through channel 202, arranged in the hood 200, or the pipe 203, connected to the channel 202. It is desirable to have the same temperature as the target temperature for the optical member and the support member that supports the optical member (for example, 23° C., preferably range of 22° C. to 24° C.), the temperature of the cooling medium flow through the channel 202 in the hood 200, and the temperature of the cooling medium flow through the channel 107 in the radiator block. Moreover, if the cooling medium flow in the radiator block is arranged opposite to the optical member, to sandwich in the Peltier element, and the cooling medium flow in the hood can be supplied from the same circulation part. In other words, it is the same cooling medium at the same temperature. This is desirable because the plurality of the circulation part (apparatus for circulating the cooling medium) need not be located. Here, if the error margin is within 0.5° C., preferably within 0.2° C., the temperature is assumed to be substantially the same.

The controller 500A controls the radiation cooling mechanism 100A so that the temperature of the optical member M detected by the optical member temperature detector 300 may be adjusted to a predetermined value. More specifically, the controller 500A controls the temperature of the radiation plate 101A by changing the voltage applied to the Peltier element 105. In other words, the controller 500A calculates the heat value to be absorbed by the radiation plate 101A and determines the temperature of the radiation plate 101A based on this heat value. Moreover, the controller 500A adjusts the voltage applied to the Peltier element 105 based on the determined temperature of the radiation plate 101A. This control adjusts the amount of heat absorbed by the radiation plate 101A from the exposure area S of the optical member M, causing the temperature of the exposure area S of the optical member M to return to the predetermined value. In other words, the controller 500A serves to maintain constant temperature. on the optical member M. Here, the controller 500A may determine the temperature of the radiation plate 101A and/or the voltage applied to the Peltier element based on the light volume of incidence light in the exposure area S or optical member M and the distribution etc. For example, when the cooling apparatus of the instant embodiment is applied to the projection optical system of the exposure apparatus, it is desirable to control the radiation cooling mechanism (the temperature of the radiation plate is controlled) according to the temperature detection result of the optical element (mirror, lens, diffraction optical element) in the projection optical system, the exposure schedule (the light volume of the light emitted from the light source, number of pulses and the pattern of the reticle etc.) and the light volume distribution in the optical element.

Also, the controller 500A changes the temperature of the cooling medium, supplied and circulated through (the channel 202 in) the hood 200, so that the temperature of hood 200 detected by the hood temperature detector 400 may be equal to the temperature of the optical member M detected by the optical member temperature detector 300. With this control, the hood 200 does not heat or cool the optical member M because the temperature of the hood 200 is equal to the temperature of the optical member M.

The cooling apparatus 1A using a Peltier element 105 with good temperature responsiveness for the radiation cooling mechanism 100A, improves the temperature control over the radiation plate 101A and precisely stabilizes the temperature of the exposure area S of the optical member M. Therefore, the cooling apparatus 1A can efficiently absorb input heat by cooling only the exposure area S, where input heat is generated by exposure of the optical member M, composed of the material with low thermal conductivity, in the vacuum atmosphere. As a result, the cooling apparatus 1A can maintain a constant temperature and achieve the desired optical performance for the optical member M without contact, by reducing deformation of the optical element due to thermal expansion which would otherwise deteriorate imaging performance. A cooling method for cooling the optical member M using the cooling apparatus 1A is similar to the cooling method 2000 that has been discussed with reference to FIG. 2. Thus, a detailed description will be omitted.

Figure 4:
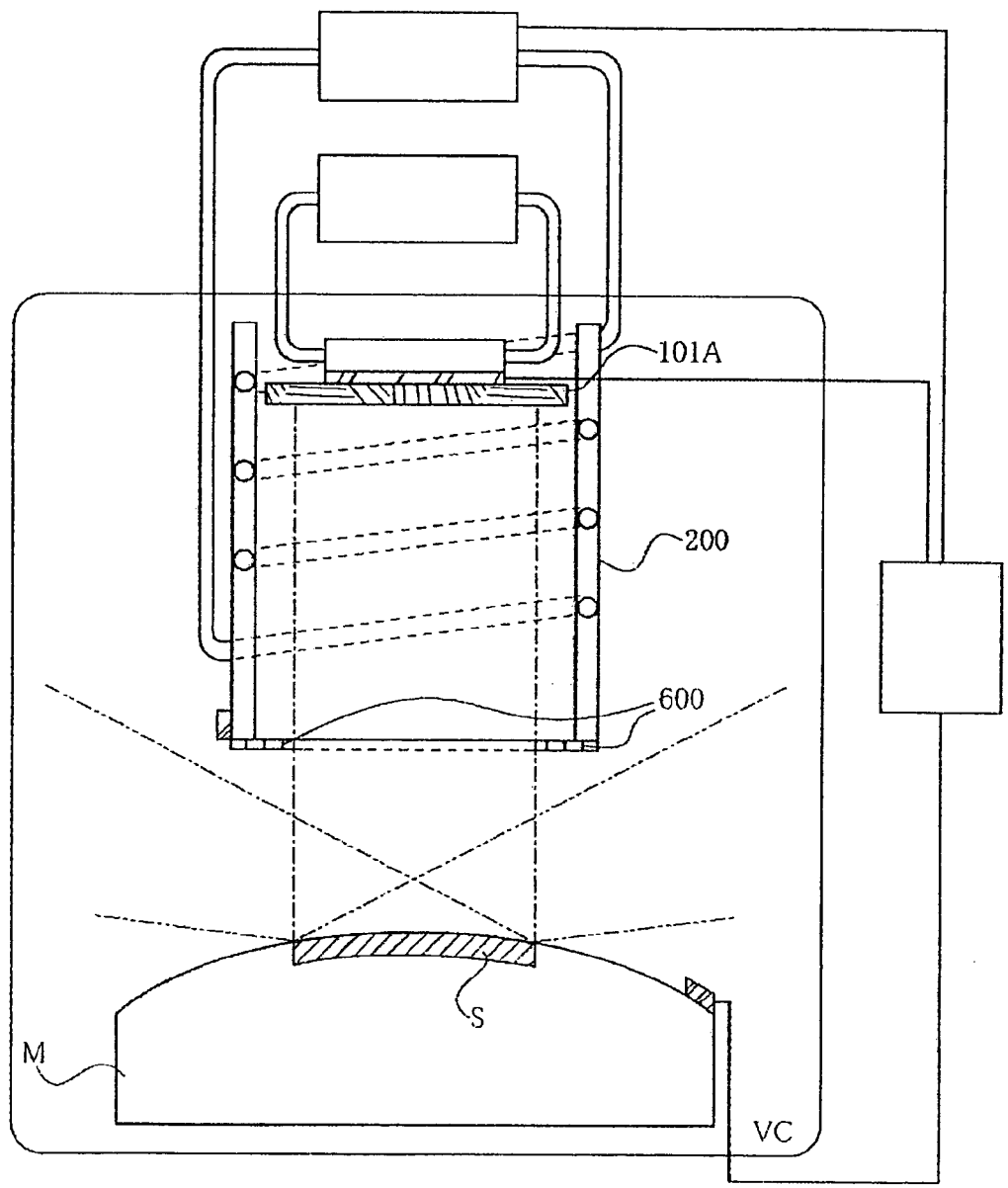
FIG. 4 is a block diagram of a cooling apparatus of one aspect according to the present invention.

FIG. 4 is for explaining the case where the radiation plate 101A cools the outside of the exposure area S of the optical member M when the shape of the optical member M is different from the shape of the exposure area S of the optical member M etc. The radiation cooling mechanism 1A, the optical member M and vacuum chamber VC are shown in the FIG. 4 as representative examples. In this case, a radiation shielding stop 600 is arranged in an opening part of the hood 200 on the optical member M side. A shape of the radiation shielding stop 600 is formed so that the radiation plate 101A cools only the exposure area S of the optical member M. In other words, the radiation shielding stop 600 is fixed to the opening part of the hood 200 on the optical member M side and functions to shield the heat ray emitted from the outside of the exposure area S. Therefore, the radiation plate 101A cools only the exposure area S of the optical member M through the radiation. The temperature of the radiation shielding stop 600 is adjusted by the heat transfer from the hood 200, at the temperature equal to the optical member M, because it is fixed to the hood 200. Therefore, the radiation shielding stop 600 does not cool or heat the exposure area S of the optical member M. Materials having high heat conductivity, for example, aluminum and copper is desirable for use as material for the radiation shielding stop 600.

Figure 5:
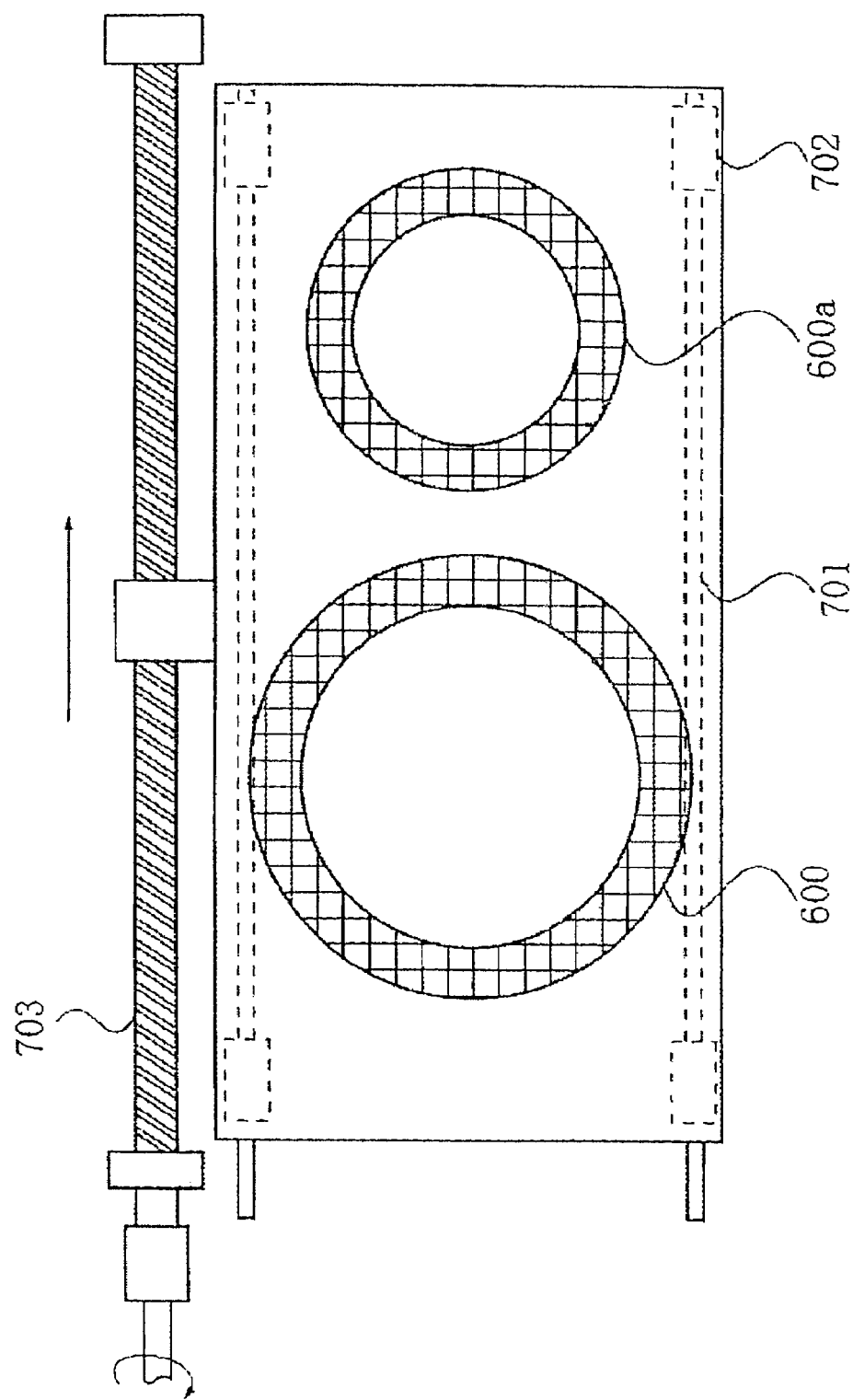
FIG. 5 is an enlarged schematic of a principal part of a radiation shielding stop.

In addition, there may be a mechanism that changes the shape of the radiation shielding stop 600 according to the NA of exposure light. FIG. 5 shows one example of the mechanism that changes the shape of the radiation shielding stop 600. 701 is a movement board with its surface side maintaining the radiation shielding stop 600 and 600a. Another example is a slide guide table 702 (described later) attached to the back side, which changes the radiation shielding stop 600 according to the shape of the required exposure area. A material having good heat conductivity and high emissivity is desirable as a movement board 701 material because the material of the movement board 701 has functions similar to the radiation shielding stop 600 mentioned above. 702 is the slide guide and a slide rail is maintained on a support board (not shown) 703 is a ball screw. The ball screw 703 is attached to the movement board 701. The movement board 701 moves in the direction of the arrow by rotating one end of the ball screw 703. With the above-mentioned composition, the shape of the radiation shielding stop 600 is changeable when necessary. This allows the radiation plate 101A to cool only the exposure area S of the optical member M through the radiation. When the mechanism, like that in FIG. 5, cannot be arranged on a space, the shape of the opening part of the radiation shielding stop 600 is made adjustable. It is adjusted according to the shape of the exposure area S. Therefore, the radiation plate 101A cools only the exposure area S of the optical member M through radiation. Needless to say, even though the explanation is based on use of cooling apparatus 1A as a representative example in FIG. 4, similar results are achieved with cooling apparatus 1. The radiation shielding stop may be a structure with a changeable opening diameter, such as an iris stop, arranged at the opening part of the hood. The position of the radiation shielding stop need not be arranged in the opening part of the hood, but may be arranged in the vicinity of the hood's center. Desirably, it should be arranged on the side of the opening part of the hood rather than the center of the radiation plate and/or the opening part of the hood.

Figure 6A:
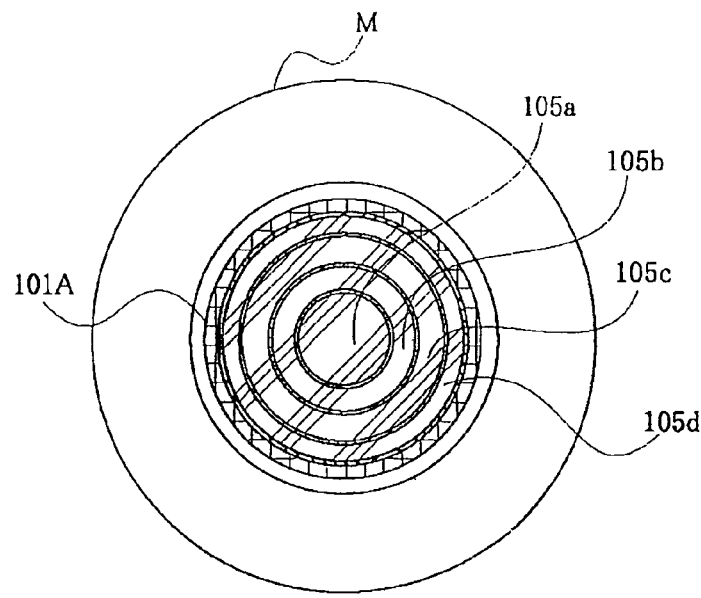
FIG. 6 is a block diagram of a cooling apparatus of one aspect according to the present invention.
Figure 6B:
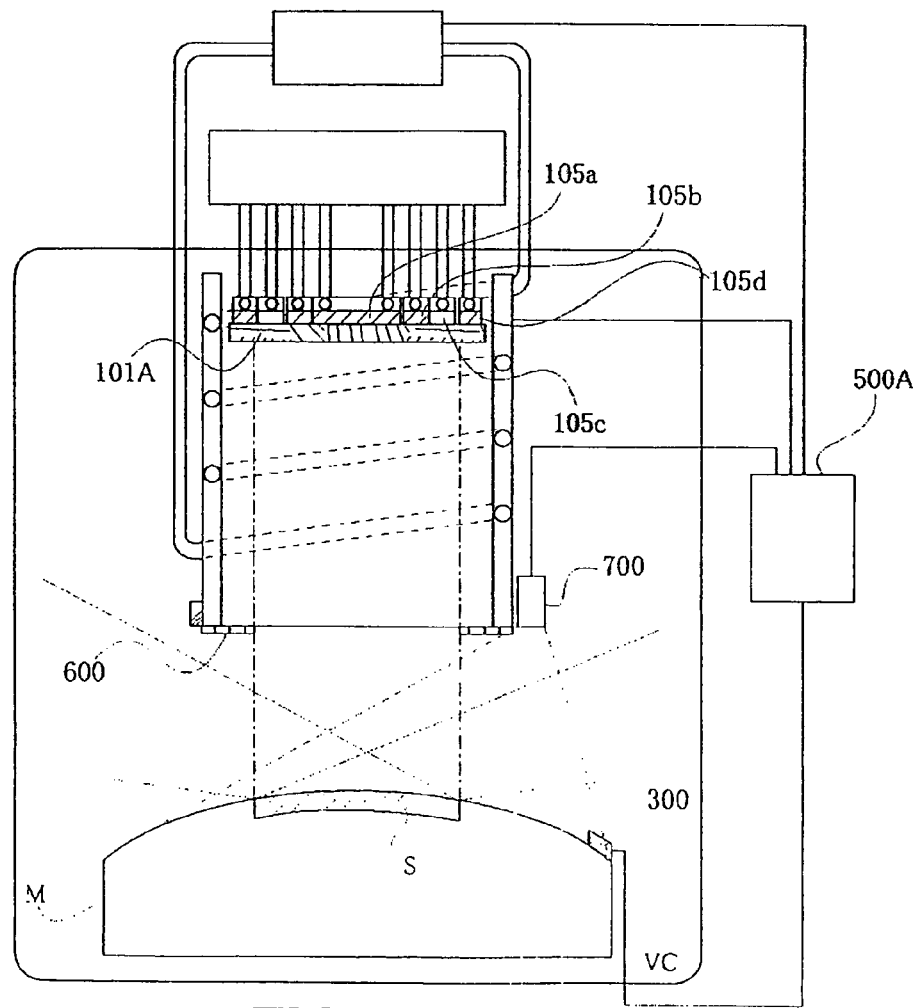

FIG. 6 is for explaining the case where the exposure area S of the optical member M has disparate temperature distribution that changes concentrically from the center point of the exposure area S. The radiation cooling mechanism 1A, the optical member M and vacuum chamber VC are shown in the FIG. 6 as representative examples. FIG. 6A is a top view of the cooling apparatus 1A and optical member M as viewed from the top. FIG. 6B is a side view of the cooling apparatus 1A, the optical member M and vacuum chamber VC as seen from a side. However, FIG. 6A omits the radiator block 10-6, the circulation part 102A, the pipe 103A, the circulation part 201, the pipe 203, the controller 500 and the vacuum chamber VC.

700 is a temperature distribution detector that detects an exposure plane temperature distribution of the optical member M without contact. The temperature distribution detector 700 is supported by a temperature distribution detector support part (not shown), inside the vacuum chamber VC and at a position, so that the temperature distribution on the entire exposure plane can be measured. A multipoint radiation thermometer and a thermography etc. that can measure multiple points of the exposure plane of the optical member M, are suitable for the temperature distribution detector 700. The temperature distribution detector 700 sends the detected value to the controller 500A (described later). In general, the measurement accuracy of the non-contact type thermometer is inferior to that of the contact type. The controller 500A corrects the measurement result of the temperature distribution detector to the value detected by the optical member temperature detector 300. As a result, the accuracy of the measurement of the temperature distribution of the exposure plane of the optical member M is improved.

The plurality of Peltier elements 105a to 105d are connected to the radiation plate 101A like the concentric circle shown in FIG. 6. The plurality of Peltier elements 105a to 105d is controlled individually by the controller 500A and cools the radiation plate 101A respectively. Therefore, the radiation plate's 101A temperature distribution corresponds to each temperature of the plurality of Peltier elements 105a to 105d. In this case, the desirable material for the radiation plate 101A is one having comparatively good heat conductivity and high emissivity.

The controller 500A corrects the temperature distribution of the exposure plane of the optical member M detected by the temperature distribution detector 700 to the value detected by the optical member temperature detector 300. As a result, the temperature distribution of the exposure plane of the optical member M can be more accurately known.

The controller 500A controls the radiation cooling mechanism 100A so that the temperature distribution of the optical member M detected by the temperature distribution detector 700 is uniform and equivalent to the predetermined value. More specifically, the controller 500A controls the temperature distribution of the radiation plate 101A by changing the voltage applied to the plurality of Peltier elements 105a to 105d respectively. In other words, the controller 500A calculates the heat value to be absorbed by the radiation plate 101A using the temperature distribution of the exposure plane of the optical member and determines the temperature distribution of the radiation plate 101A based on the heat value. For example, the temperature is highest at the center of the exposure area S and decreases radially outward. The Peltier element 105a has the lowest temperature, followed by the low temperatures of 105b, 105c and 105d, respectively. Moreover, the controller 500A adjusts the voltage applied to the plurality of Peltier elements 105 respectively, based on the determined temperature distribution of the radiation plate 101A. This control adjusts the heat value absorbed by the radiation plate 101A from the optical member M, causing the optical member M to become uniform at a predetermined value. In other words, the controller 500A serves to maintain a uniform and constant temperature distribution in the optical member M. Needless to say, even though cooling apparatus 1A is used as a representative example in FIG. 6 for explanation purposes, similar effect in radiation can be achieved with cooling apparatus 1.

Therefore, when the exposure area S of the optical member M is heated and disparate temperature distribution results, the cooling apparatus 1 or 1A can keep the temperature of the exposure area S of the optical member uniform and constant. Moreover, it explains the case where the exposure area S of the optical member M has the disparate temperature distribution that changes concentrically from the center point of the exposure area S. In cases where the temperature of the exposure area S has other distribution patterns, it is needless to say that other arrangements can be used, as well as changes to the shapes and number of the plurality of Peltier elements.

In FIGS. 1 to 6, the cooling apparatus 1 and 1A are arranged opposite the radiation cooling mechanism 100 and 100A to the exposure plane of the optical member M. However, it is not possible to arrange the radiation cooling mechanism 100 and 100A at a position opposite to the exposure plane of the optical member M for space reasons and/or because the angle of exposure light incidence is small. It may radiation cool the exposure area S of the optical member M from a diagonal direction.

Figure 7A:
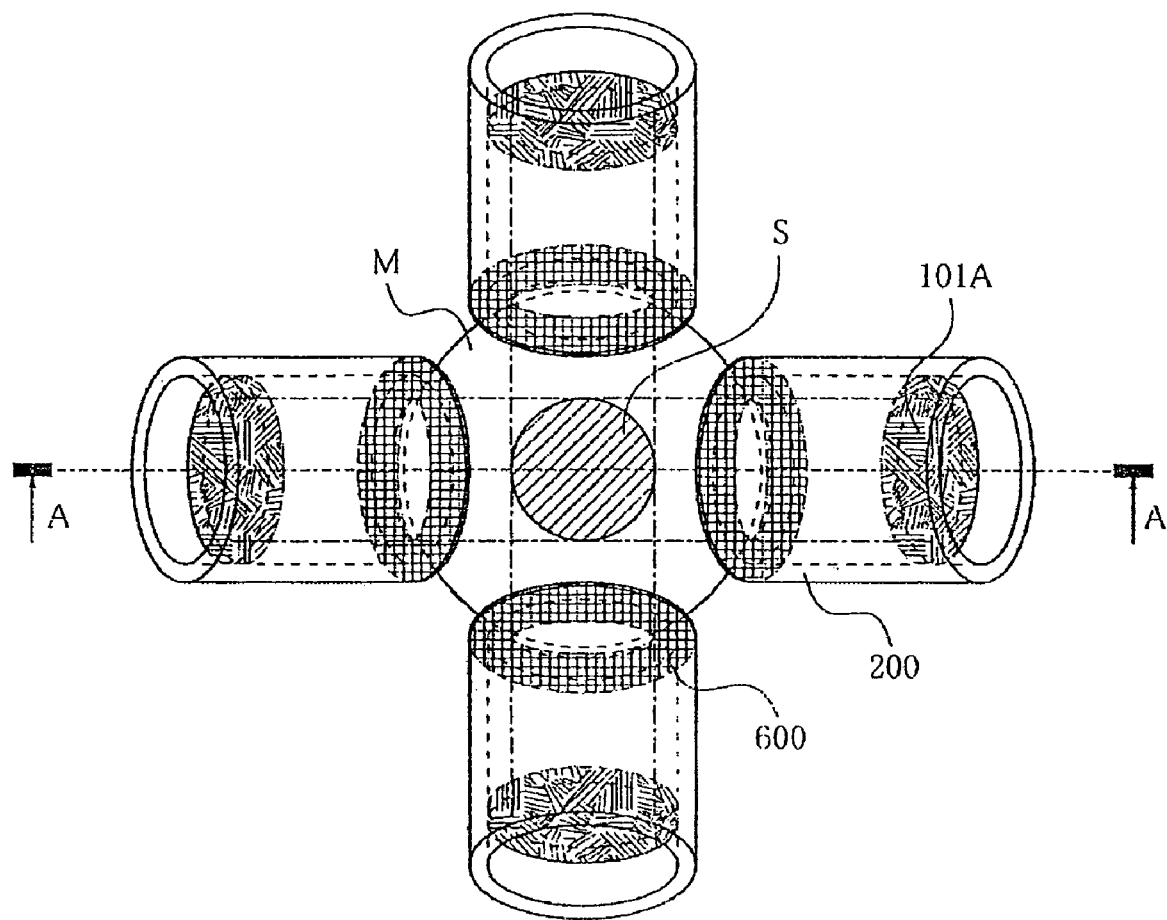
FIG. 7 is a block diagram of a cooling apparatus of one aspect according to the present invention.
Figure 7B:
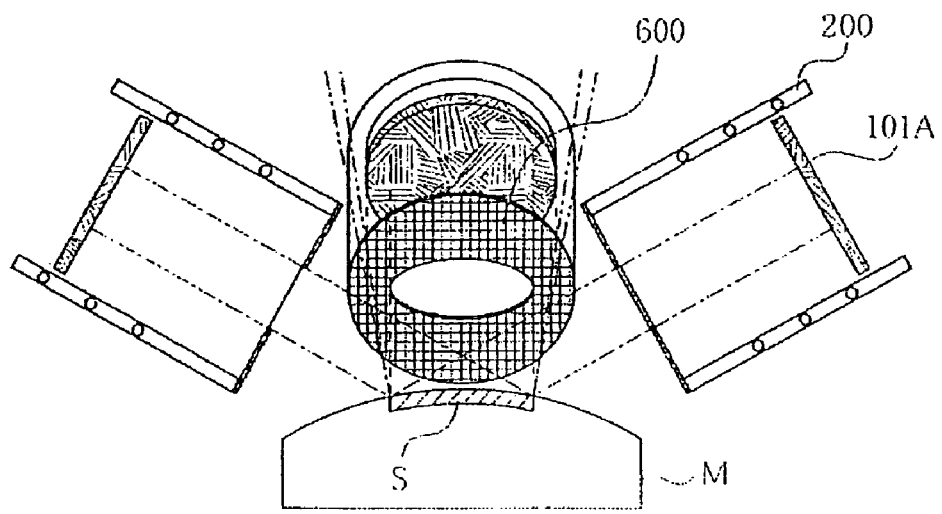

FIG. 7 is an embodiment of the case where apparatus 1A is used to cool the exposure area S of the optical member M from the diagonal direction. FIG. 7A omits the optical member M, the radiation plate 101A, the hood 200 and the radiation shielding stop 600. FIG. 7A is a top view of the cooling apparatus 1A and the optical member M as seen from the top. FIG. 7B is an A-A sectional view of the cooling apparatus 1A and the optical member M. As shown in FIGS. 7A and 7B, the cooling apparatus 1A can only radiation cool the exposure area S of the optical member M from the diagonal direction.

However, when the exposure area S is viewed locally, cooling from the diagonal direction causes bias in areas distant from the radiation plate 101A. Thereby, bias is caused to the mode coefficient of the radiation plate 101A and the exposure area S resulting in an inability to uniformly cool exposure area S. Therefore, when the exposure area S of the optical member M is cooled from the diagonal direction, as shown in FIGS. 7A and 7B, plurality of the cooling apparatus 1A is arranged around the center point of the exposure area S at equal intervals. The bias of the radiation cooling value to the exposure area S cancels each other. Therefore, the exposure area S of the optical member M can be uniformly cooled. In FIGS. 7A and 7B, four cooling apparatus 1A are arranged around the optical member M at equal intervals. However, needless to say, the number of cooling apparatus 1A can be anything when it is possible to uniformly cool the optical member M without shielding the exposure light. The embodiment shown in FIG. 7 uses cooling apparatus 1A, but cooling apparatus 1 can be used to achieve similar results.

As shown in FIG. 7, one cooling apparatus is good. In this case, the gradient temperature (temperature distribution) is formed in the radiation plate. In other words, the temperature of areas where the radiation plate is mutually different are different. Therefore, control of the temperature of the area where the distance to the optical member (mirror etc.) of the radiation plate is the shortest may higher than the temperature of the area where the distance to the optical member of the radiation plate is longest. In this case, the radiation plate is divided into plurality areas (parallel to a direction of tangent in center point of the optical member) according to the distance from the optical member. The cooling apparatus individually controls the temperature for these divided plurality areas and there is a temperature difference between these plurality areas. Moreover, the radiation plate, made of a material with low thermal conductivity, is contacted with the Peltier element (in other words, a member for cooling the radiation plate) in the area where the distance to the optical member of the radiation plate (side near an area that is furthest from the middle position with the area near where the distance to the optical member of the radiation plate is the longest, more desirable, an area of ¼ or less of the distance between the areas nearest to the area where the distance to the optical member of the radiation plate is the longest) is the longest, and the temperature distribution is automatically formed in the radiation plate. In the radiation plate, another Peltier element is contacted at a position opposite to the position that the Peltier element is contacted with the radiation plate to form the temperature distribution of the radiation plate.

Figure 8A:
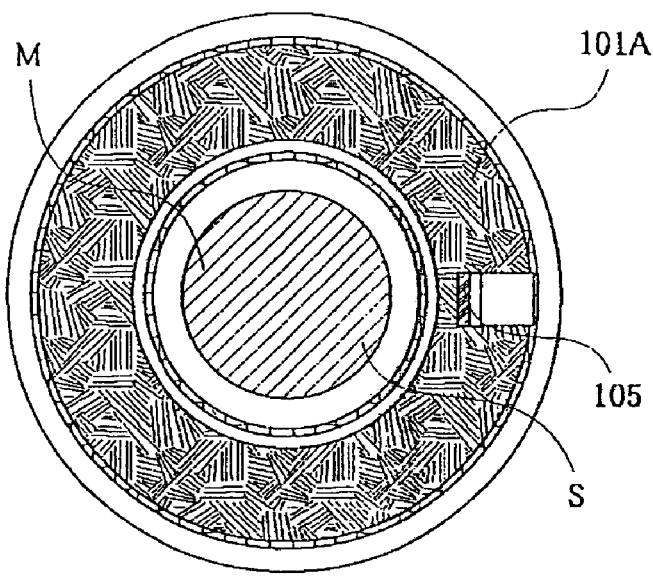
FIG. 8 is a block diagram of a cooling apparatus of one aspect according to the present invention.
Figure 8B:
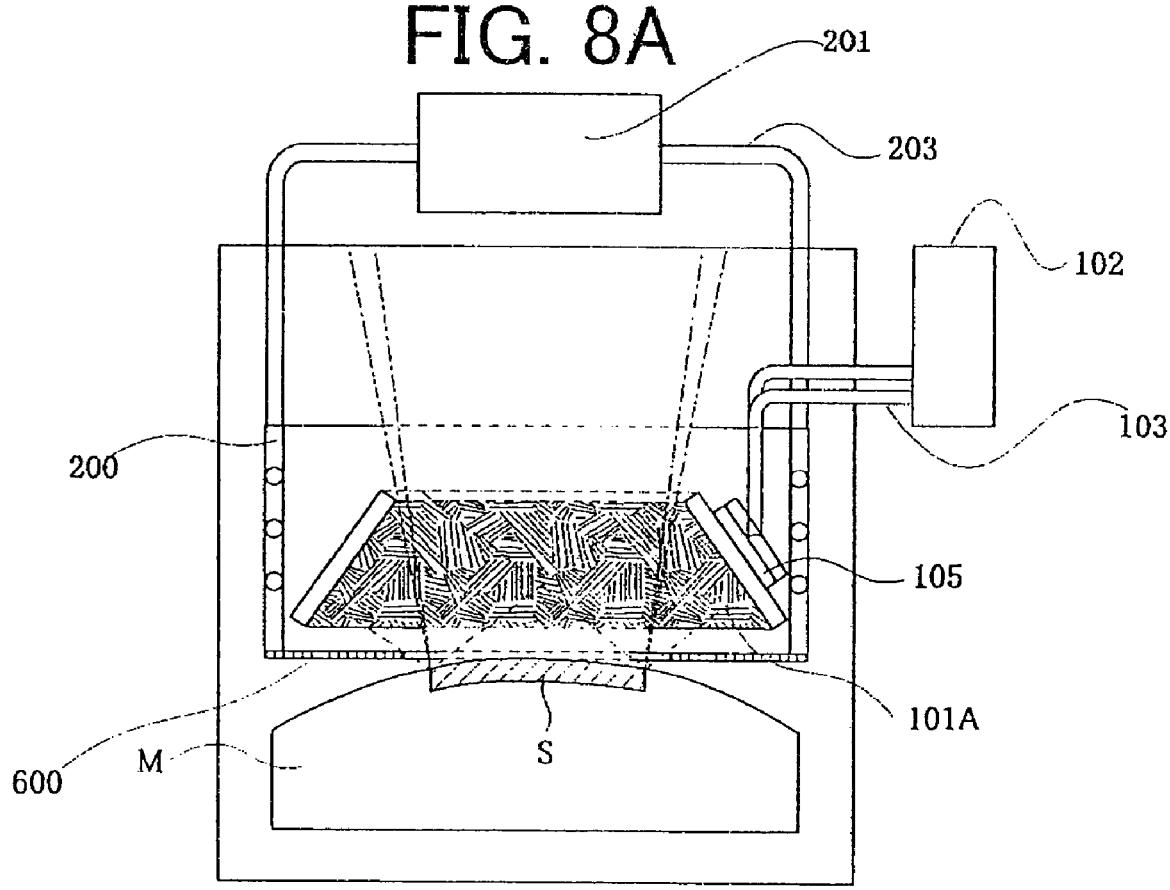

FIG. 8 is a further embodiment of the cooling apparatus 1A. The parts not explained are similar to the embodiment shown in FIG. 1. In FIG. 8, the radiation plate 101A is a rotor that has a section shaped like the Japanese character eight (character type of "ハ") and is inclined in a direction opposite the exposure area S and in a direction normal to the center part of the exposure area S. In other words, the radiation plate 101A, shaped like a hemisphere or hypostome to cover the exposure area S, have a removable part from a side, that can be removed if it interferes with the optical path of incidence light to the optical member M.

However, although, the radiation plate in the embodiment of FIG. 8 may be a rotor that has the section shape like the Japanese character eight, it does not need to be a complete rotor. It may be part of a rotor (for example, a side of frustum). In other words, a part from the side of the hypostome and/or a part from the side of the hemisphere mentioned above. The shape of the radiation plate does not have to be a rotor or a part of the rotor but can be shaped like the side of a trigon pyramid and/or quadrangular pyramid (multiplicity pyramid) of course, when the cooling efficiency (temperature adjusting efficiency) permits, the shape of the radiation plate may be like the side of a column or a side of a pole.

It is desirable that the sectional shape of the radiation plate has curvature with the concave side turned to the exposure area S. In addition, a curvature radius may be same as the distance of the radiation plate and the center part of the exposure area S or be longer than the distance of the radiation plate and the center part of the exposure area S.

The radiation plate 101A may cool the exposure area S of the optical member M efficiently without shielding the exposure light L by combining the above-mentioned radiation plate 101A and the radiation shielding stop 600. Moreover, the radiation plate 101A can cool the exposure area S more uniformly because it is almost uniformly arranged around the circumference of the center point of the exposure area S. The present embodiment can reduce costs and be miniaturized when compared with the embodiment in FIG. 7 because it needs only one hood 200. However, if necessary, a plurality of Peltier elements may be connected to the back of the radiation plate 101A. Needless to say, although cooling apparatus 1A is shown as an example in FIG. 8, similar results are achieved with cooling apparatus 1.

Figure 9A:
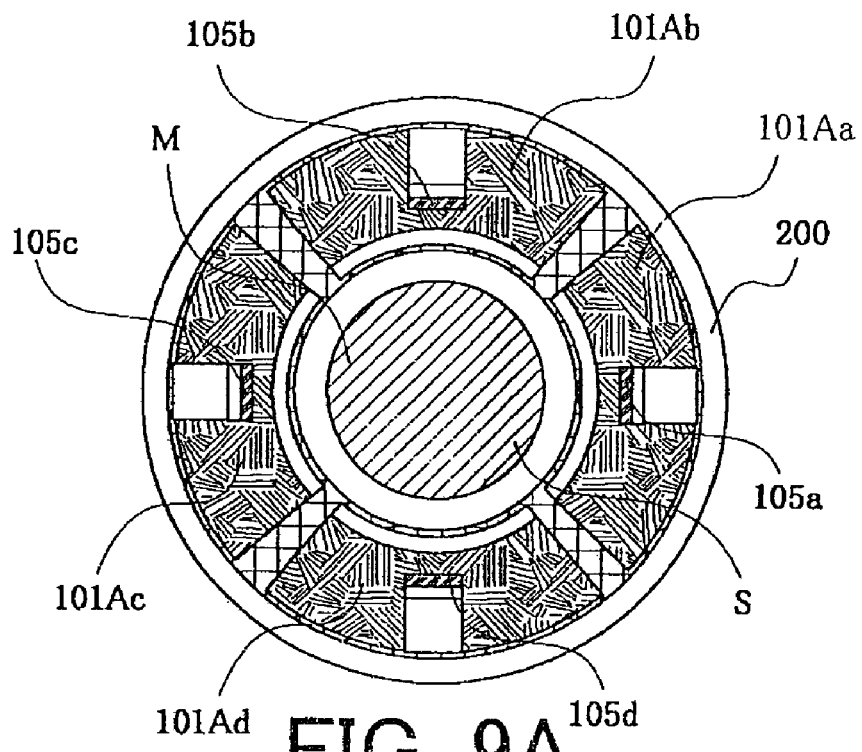
FIG. 9 is a block diagram of a cooling apparatus of one aspect according to the present invention.
Figure 9B:
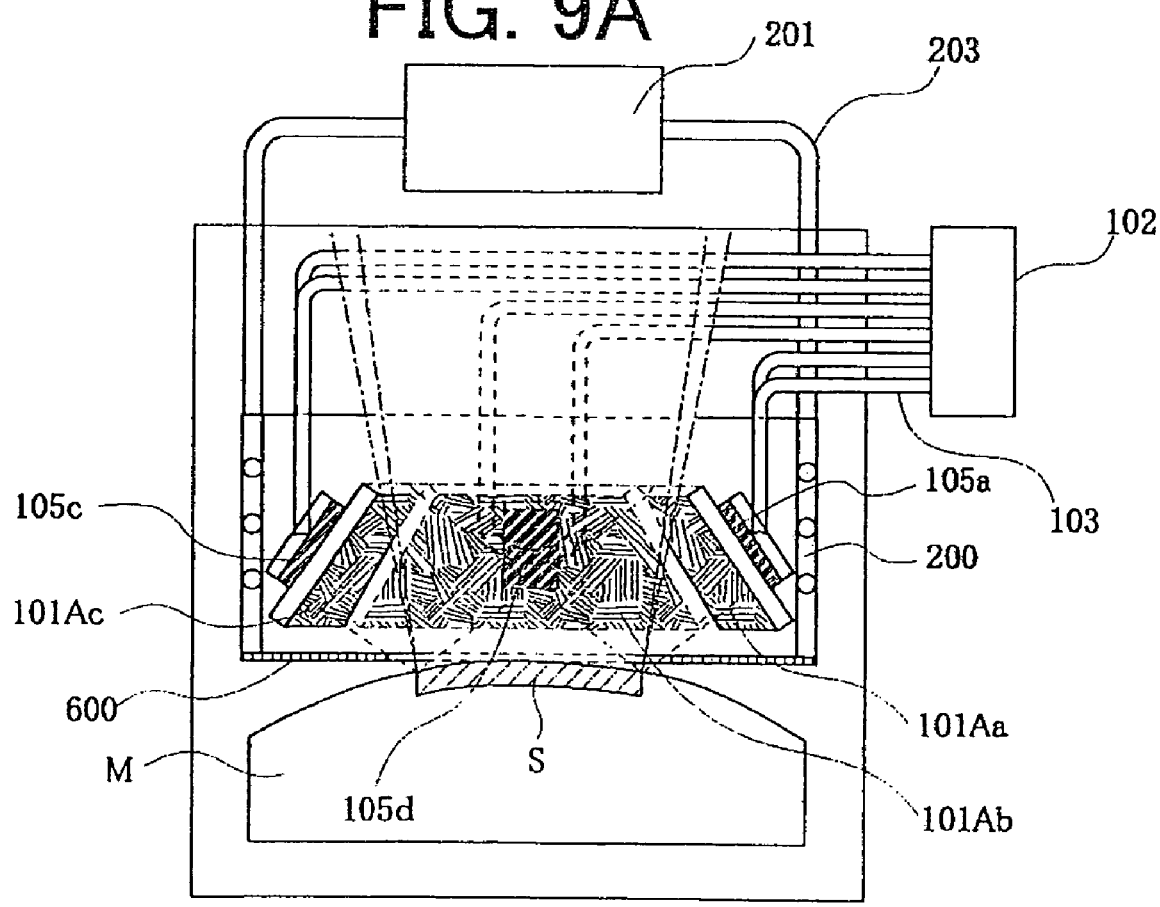

The plurality of radiation plates 101Aa, 101Ab, 101Ac, and 101Ad are arranged in the one hood as shown in FIG. 9. The shape of the plurality of radiation plates 101Aa-Ad are formed so that the radiation mode coefficient, of the exposure area S of the optical member M, grows bigger near the optical path of the exposure light L.

Peltier element 105a, 105b, 105c, 105d is connected respectively on the back of the plurality of radiation plates 101Aa-Ad. The temperature of the plurality of radiation plates 101Aa-Ad can be controlled individually. However, in FIG. 9, four radiation plates 101A are arranged around the exposure area S at equal intervals. However, the arrangement and number of the plurality of Peltier elements if necessary without shielding the exposure light as can uniformly cool the exposure area S of the optical member M. In FIG. 9, even though the cooling apparatus 1A is used as an example, similar results can be achieved with cooling apparatus 1. Various patterns to the shape of the radiation plate in FIG. 8 were also thought about.

Figure 10:
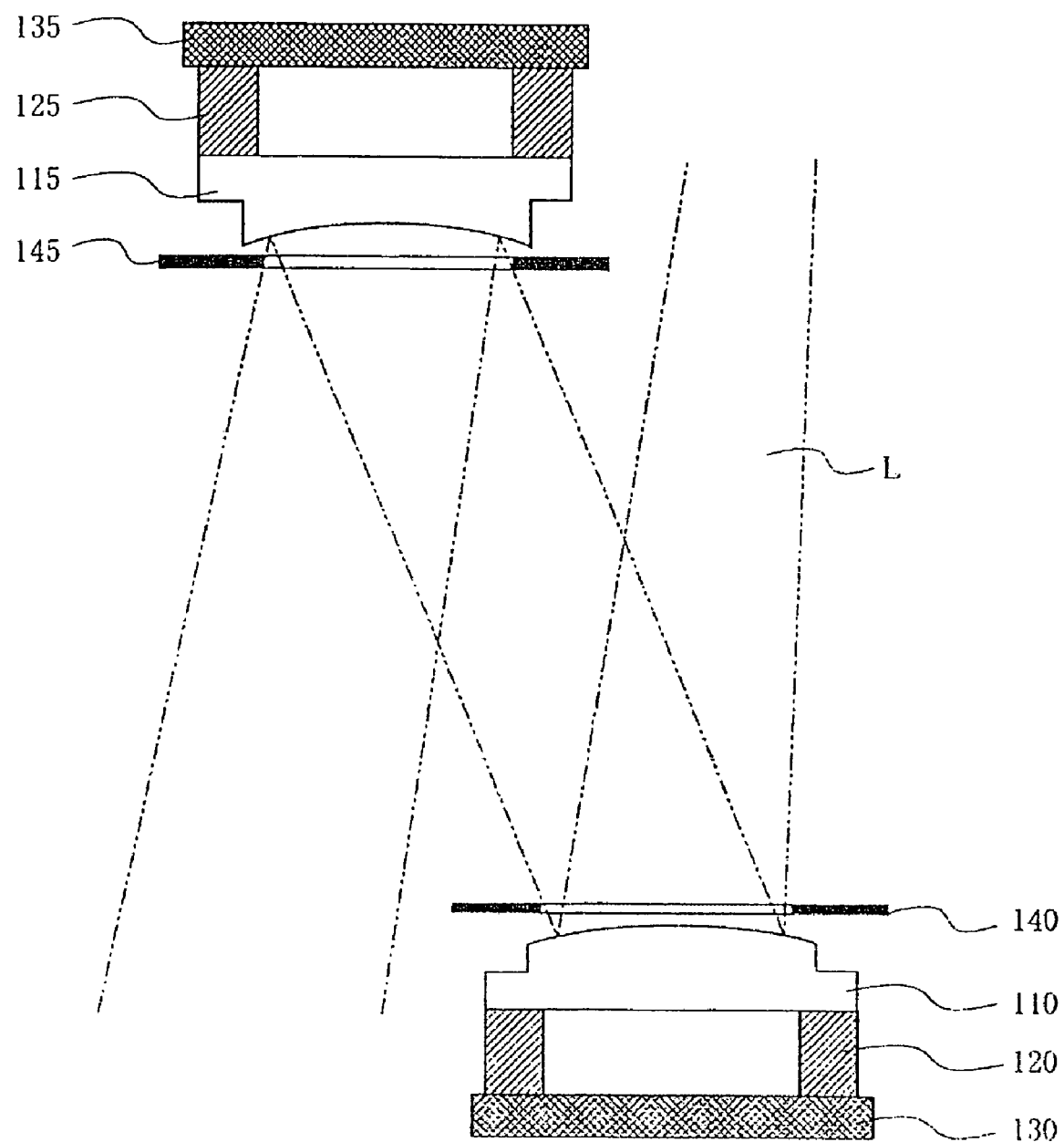
FIG. 10 is a side view of a shielding structure of one aspect according to the present invention.

A description will be given of a shielding structure (a stop apparatus) 100B with reference to FIG. 10. The shielding structure may be applied to the projection optical system and the illumination optical system of the exposure apparatus and any known optical system. In each figure, the same reference numeral denotes the same element. Thus, a duplicate description will be omitted.

In this figure, 110 and 115 are mirrors which images light using reflection. A multilayer film for reflecting the light is applied onto the reflection plane of the mirrors 110 and 115. The multilayer film has the effect of enhancing the light. It is conceivable that a multilayer film applied to the mirrors 110 and 115 comprises, for example, a molybdenum (Mo)/silicon (Si) multilayer film that alternately laminates Mo and Si layers or a molybdenum (Mo)/beryllium (Be) multilayer film that alternately laminates Mo and Be layers. Of course, the present invention does not limit the multilayer film to the above materials and does not prevent the use of other multilayer films that operates or have effects similar to those above.

120 and 125 are support members that supports the mirror 110 and 115, and has a structure that does not deform the mirror. Desirably support member 120 and 125 should be made of materials with low thermal expansion such as invar and super-invar, to prevent deformation with heat change. The method for kinematically supporting the mirror is one example of a structure that does not deform the mirror.

130 and 135 are base plates that maintain the support members 120 and 125. Both of these are supported to a mirror barrel (not shown). It is desirable that the base plate 130 and 135 are made of low thermal expansion material such as invar and super-invar, to prevent transformation during heat change, as well as support member 120 and 125. Moreover, it is preferable that these structures have enough stiffness so as not to deform the support member 120 and 125 either.

L is an exposure light that is incidence in the mirror. The exposure light is emitted from a light source (not shown), reflected off the plurality of mirrors, and is incidence on mirror 110 of the present figure. The exposure light is reflected off the mirror 110 and incidence on mirror 115.

140 and 145 are shielding stops. These are supported to the structure (not shown). The shielding stops 140 and 145 limit the flux of the exposure light L and shields the heat radiated from other objects. Thereby, the light incident in the mirror is limited to the part necessary for practical use. Because the shielding stop 140 and 145 limit heat from the outside, by not reflecting and emitting heat, it limits the undesirable deformation of the mirror. Therefore, to change the surface condition and emissivity, it is necessary to give surface treatment to the surface of the mirror 140 and 145.

There are two methods for changing the emissivity. The first method is to adjust the emissivity of the shielding stop 140 and 145 to almost 0, ideally, to 0.1 or less. Thereby, all heat is reflected, while unnecessary heat is incidence in the mirror. The method for adjusting the emissivity to almost 0 is to grind the surface of the shielding stop 140 and 145, and deposit reflective materials to the surface. As an example of the former method to achieve this, there is a method of electrolyze grinding for stainless steel. For the latter method, there is a method for depositing aluminum. However, assuming emissivity to be almost 0, the limited light etc. reflected on the shielding stops 140 and 145 may cause ghosts and flares. Thereby, it is desirable to consider the shape of the shielding stop 140 and 145 so as not to cause such problems. Moreover, it is possible to absorb heat because the emissivity is almost 0.

The remaining heat spreads to the back side of the shielding stops 140 and 145, and is radiated to the mirror's sides. The shielding stop 140 and 145 may be piled up to the multistep as a method of improving this point. Therefore, the remaining heat that is not reflected by the first step of the shielding stop, is absorbed by the next step of the shielding stop, to reduce incidence heat in the mirror. In this case, it is desirable that the structure does not contact, so as not to receive the influence of heat transfer.

The second method is to adjust the emissivity of the shielding stop 140 and 145 to almost 1, ideally, to 0.9 or more. Unnecessary heat is absorbed by the shielding stop and at the same time, its temperature is adjusted to the set up environment temperature. As a result, unnecessary heat does not incident to the mirror.

Figure 11:
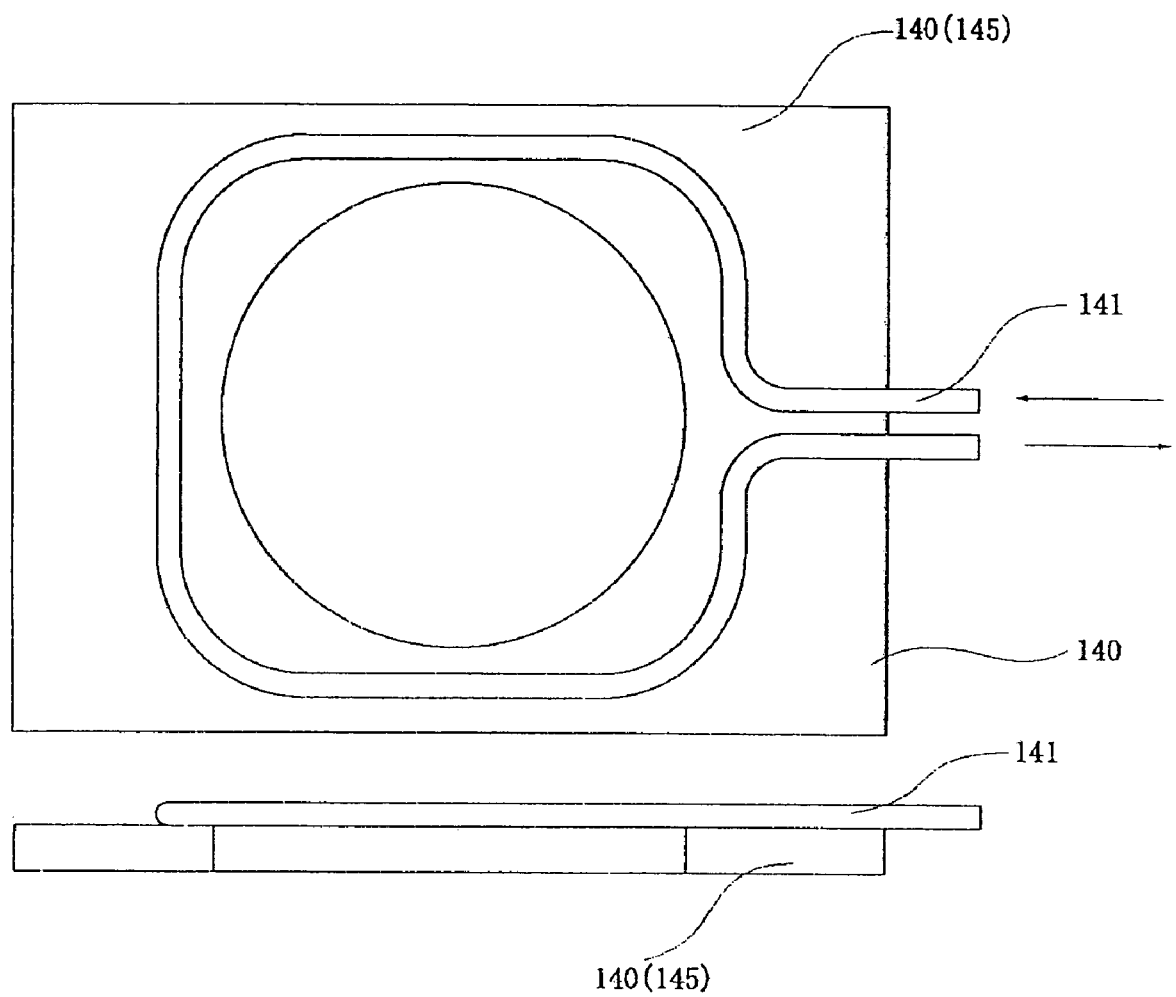
FIG. 11 is a view showing one example of a method where an emissivity of a shielding stop is assumed to be almost 1.

FIG. 11 is a view showing one example of a method where the emissivity of the shielding stop 140 and 145 is assumed to be almost 1. Here, the top view describes the top side, and the sectional view describes the lower side. 141 is a piping. The fluid temperature is adjusted to become equivalent to the set up environment temperature. For example, a flow of 23° C. flows to the piping 141. Any gas or liquid, an example being pure water, is acceptable fluid if the fluid can exhaust heat. Thereby, unnecessary heat that incident to the shielding stop 140 and 145 can be exhausted. The piping is made of resins, metals such as stainless, and so on. When used in a vacuum, the metal is desirable because the gas exhausted from the material is reduced. In addition, the effect is improved by processing the surface with electrolytic polishing etc.

Figure 12:
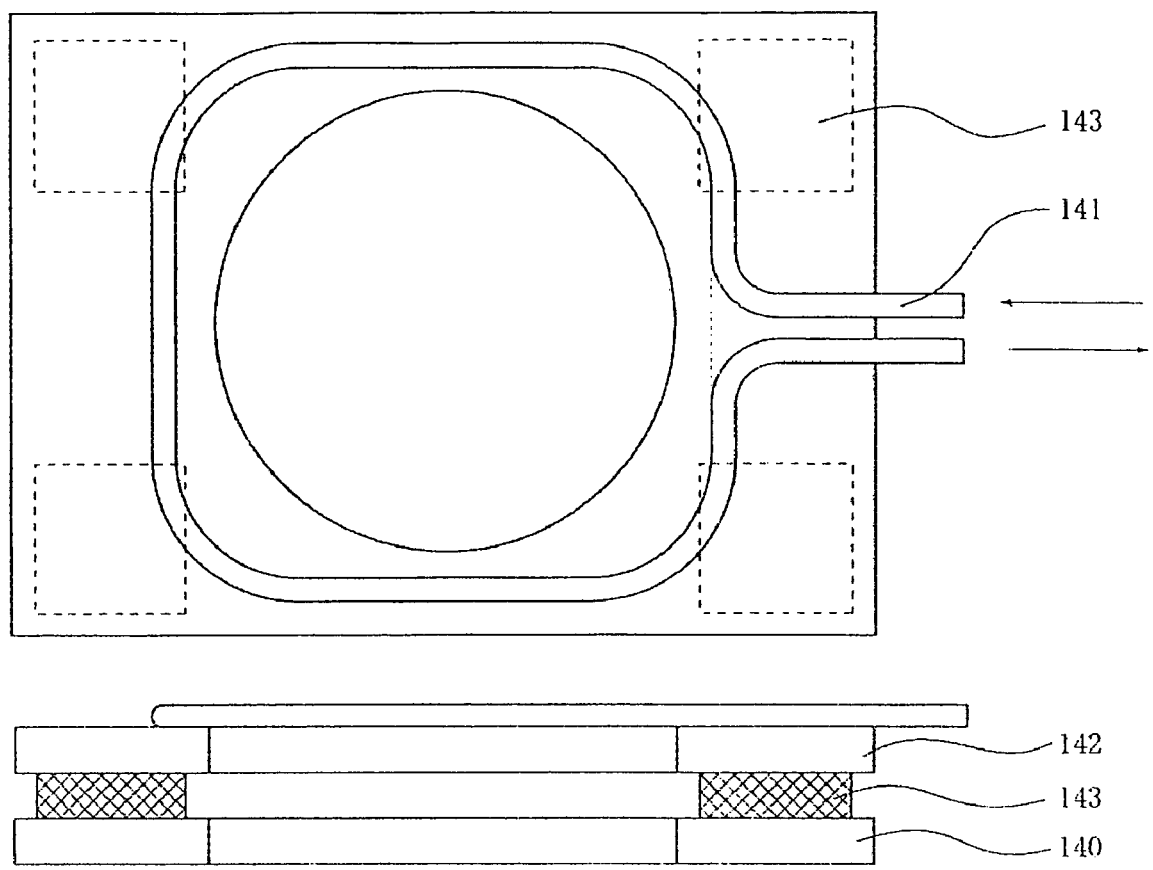
FIG. 12 is a view showing how to use a Peltier element as a structure for exhausting heat.

FIG. 12 is a view showing how to use the Peltier element as a structure for a heat exhaustion method. 142 is a support board to maintain the piping 141 which transfers the heat exhausted from the Peltier element (which will be described later). Copper and aluminum having comparatively good heat conductivity are desirable as a material for the support board 142. The under surface of the support board 142 has an insulation part to connect to the Peltier element (which will be described later). 143 is the Peltier element. The Peltier element 143 is arranged thermally parallel to each other, for example, a p-type semiconductor and an n-type semiconductor. The "Peltier effect" is a phenomenon in which heat is transferred due to differences in electrical conductivity when current flows through two types of conductor or semiconductor contacts. Therefore, temperature difference is generated between the top surface and the bottom surface of the Peltier element 143. For example, when the shielding stop 140 and 145 is cooled, the support board 142 is heated. The Peltier element 143 is connected to the above-mentioned insulation part by metallized metal, such as deposition with good heat conductivity and soldering etc. Moreover, a thermometer to measure the temperature change of the shielding stop is connected to the shielding stop 140 and 145 (not shown). In this structure, when unnecessary heat incidents to the shielding stop, the temperature of the shielding stop is controlled by the following, which will be described next. The thermometer connected to the shielding stop 140 and 145 rises. The measurement value of the thermometer and the set up environment temperature are compared until the current flows to the Peltier element 143 is equivalent to the set up environment temperature. Thereby, the temperature of the shielding stop 140 and 145 is maintained constant. When the Peltier element operates, heat generated is exhausted to the piping 141 through the support board.

Excluding unnecessary heat becomes possible by using the first method and the second method. When the shielding stop 140 and 145 is made into a multistep, heat that influences the mirror can be exhausted using the first and second method.

Figure 13:
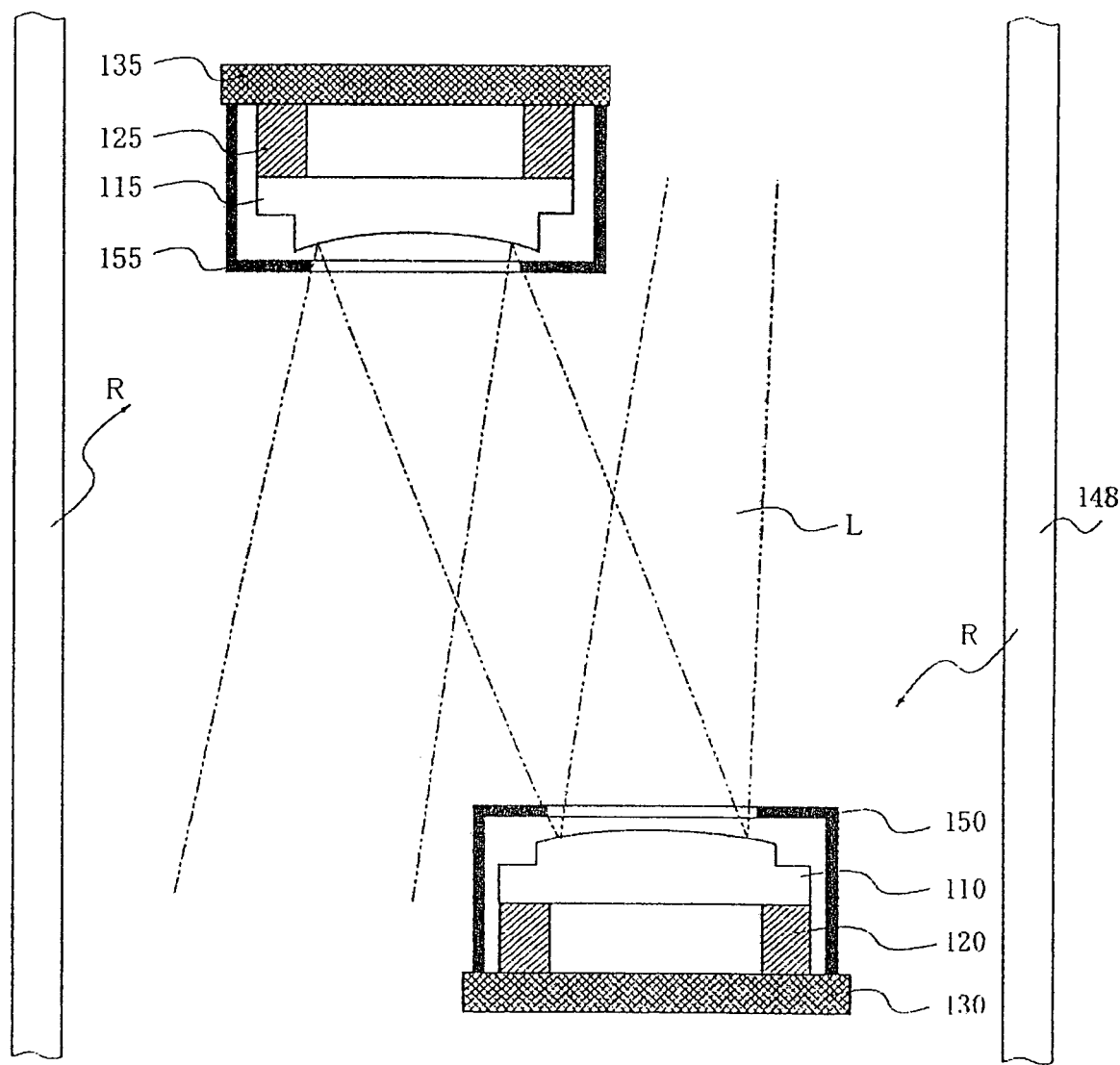
FIG. 13 is a sectional view of a structure that covers unnecessary heat more exactly.

FIG. 13 is a schematic sectional view of the structure that covers unnecessary heat more exactly. 148 is a mirror barrel that maintains the optical system. The mirror barrel 148 surface is treated to reduce the influence of the heat. For example, when the mirror barrel 148 is made of stainless steel, electrolytic polishing is used. R is heat generated from the mirror barrel 148. 150 and 155 is a shielding mirror barrel with an opening part that limits the incidence of the exposure light L in the extremity. The opening (of the shielding mirror barrel) has similar functions as the shielding stop mentioned above. The shielding mirror barrel has similar functions as FIGS. 11 and 12 mentioned above. The present figure is a structure similar to FIG. 11. Effectively limiting the heat (radiation heat) emitted from the mirror barrel and another member becomes possible. In this present figure, the shielding mirror barrels 150 and 155 are arranged to cover the support members 120 and 125, but may be arranged to cover the entire the mirror. In other words, the shielding mirror barrel (shielding member) prevents transmission of radiation heat from the member of the mirror barrel etc. to the mirror (especially, the area of the mirror where light is not irradiated). Therefore, in the area surrounding the optical member, it is desirable that the shielding mirror barrel is arranged to cover almost all of the area that does not shield the optical path of incident light to and emitted light from the mirror, and does not interfere with the support member that supports the mirror.

In FIG. 13, the support member that supports the mirror (reflection member) is supported by a base plate 130, which supports the shielding mirror barrel 150. However, it is desirable that the shielding mirror barrel is supported to the member besides the mirror. In other words, it is desirable that the shielding mirror barrel 150 is supported to a support mechanism different from the base plate. The support mechanism that supports the shielding mirror barrel may support the cooling (temperature adjustment) mechanism that cools (temperature adjusts) the surface side of the mirror by the radiation and the cooling (temperature adjustment) mechanism that cools (temperature adjusts) the back side of the mirror by the radiation.

Figure 14:
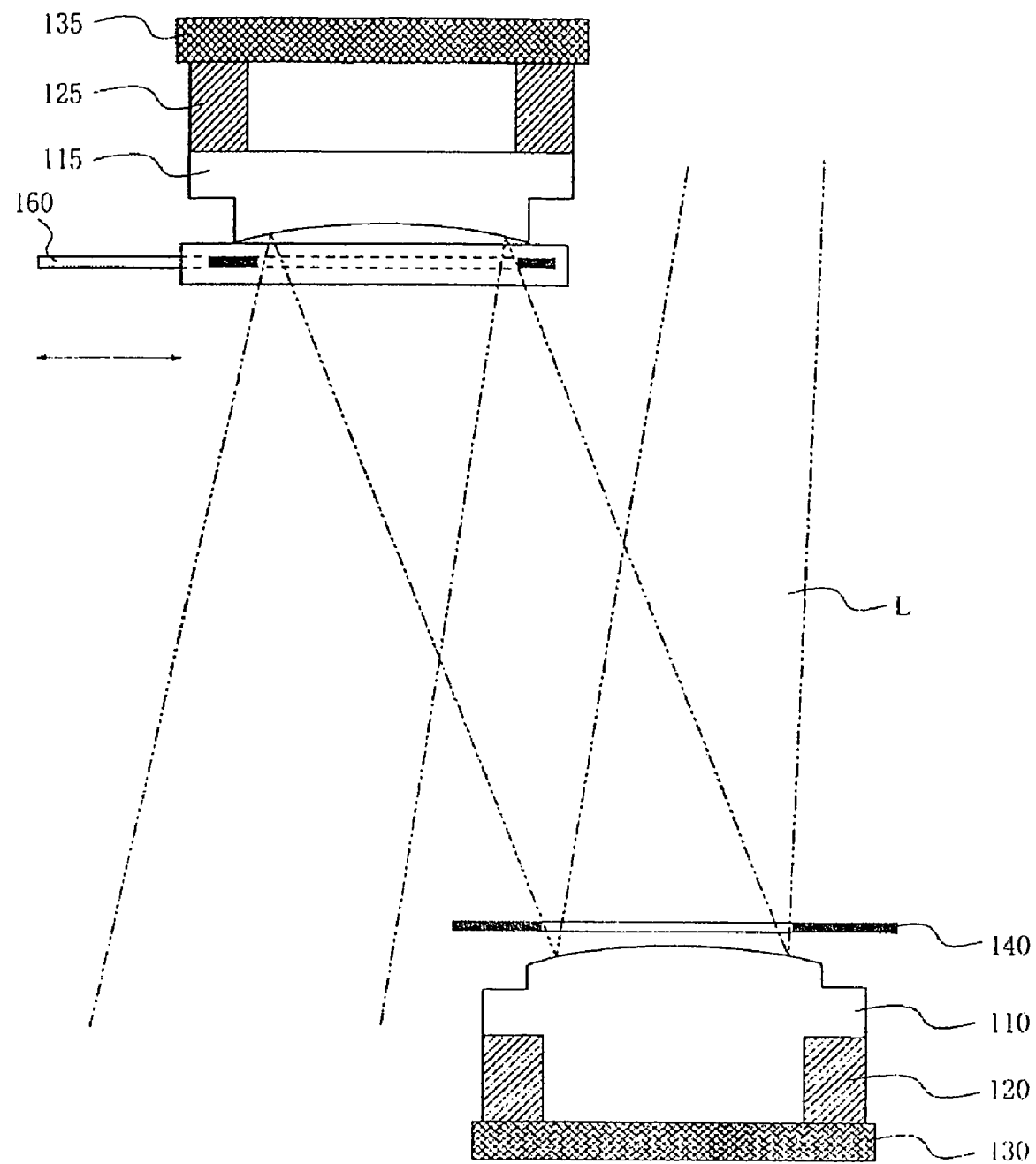
FIG. 14 is a sectional view of a variable NA stop of variable aperture diameter with a structure to cover unnecessary heat.

FIG. 14 is a schematic sectional view of a variable NA stop with variable aperture diameter that is configurable to a structure that covers unnecessary heat. In the present figure, 160 is a variable NA stop. The variable NA stop changes the NA of a projection mirror. A description will be given of the structure with reference to FIG. 15.

Figure 15:
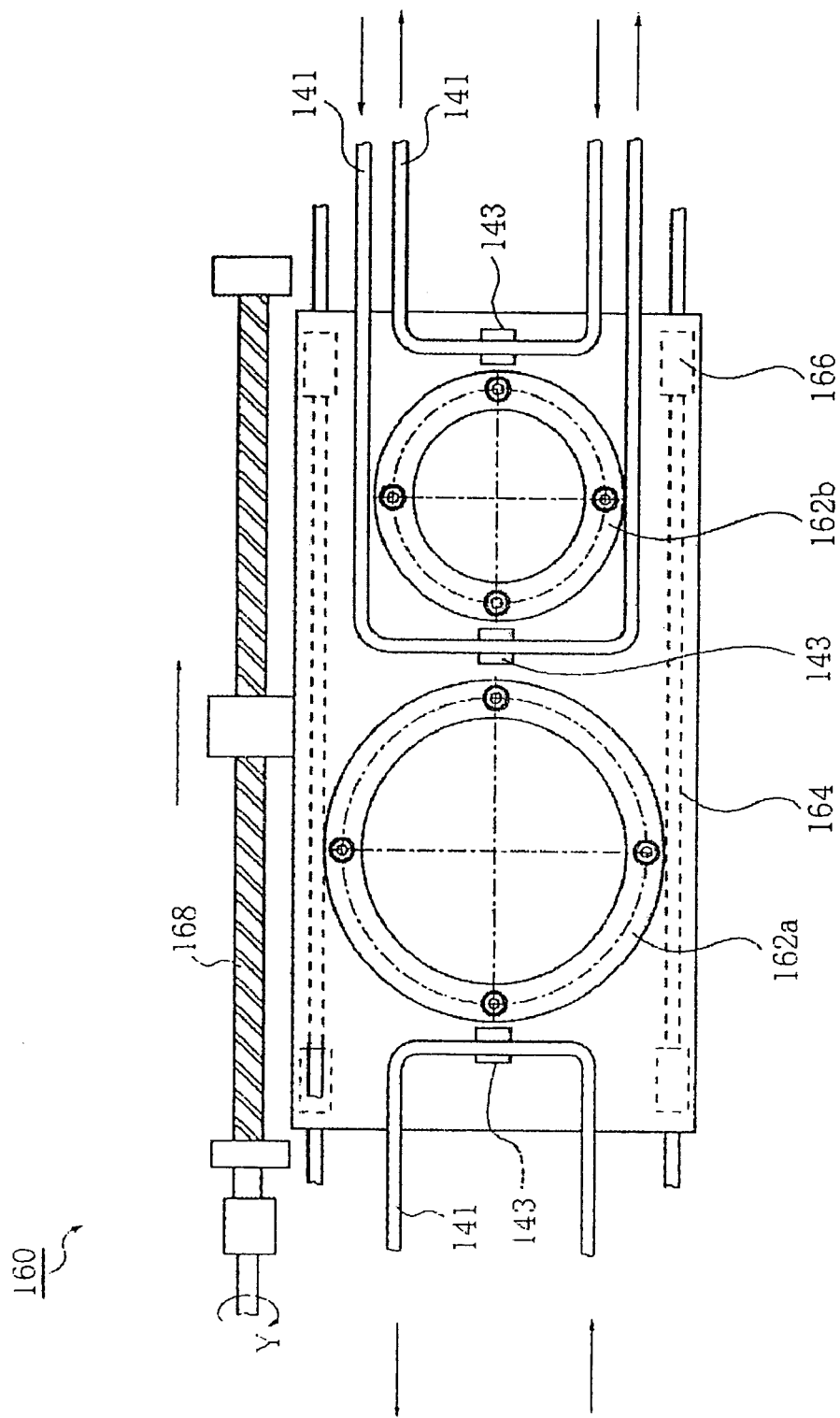
FIG. 15 is a bottom view of a NA stop structure.

FIG. 15 is a bottom view of the NA stop structure 160, 162a and 162b are NA stops. These stops changes the NA of the projection mirror. 164 is a movement board with the surface side maintaining the piping 141, the Peltier element 143 and the stop 162a and 162b. On the other hand, a slide guide table 166, which will be described later, may be attached to the back side to change the NA stop according to the necessary NA. Here, the movement board 164 functions similar to the above-mentioned shielding stops 140 and 145.

Materials with high heat conductivity, for example, copper and aluminum is desirable for the material of the movement board 164. The movement board 164 has an insulation part to connect to the Peltier element in the top surface as well as to the shielding stop 140 and 145. The top surface is processed through a metallized treatment. 166 is a slide guide. A guide rail is maintained on a support board (not shown). 168 is a ball screw. A nut of the ball screw 168 is attached to the movement board 164. The movement board 164 moves in the arrow's direction (the right and left direction in the figure) by rotating at one end of the ball screw. When necessary, NA is assumed to be changeable according to the structure mentioned above. Unnecessary heat can be excluded by the NA stop mechanism 160. The above-mentioned NA stop mechanism is designed so that the emissivity of the movement board and the NA stop is almost 1 (desirably more than 0.9 and less than 1.0). However, it is also possible to have the emissivity at almost 0 (desirably more than 0 and less than 0.1).

Other methods may be used. For example, a linear motor may be used as the movement mechanism instead of the ball screw method used in the above-mentioned structure. An iris stop mechanism (a stop mechanism that changes the opening diameter by moving a plurality of boards with a cam mechanism) instead of the two stops 162a and 162b as the method of changing the NA stop. Moreover, in the present figure, the NA stop mechanism 160 has a mechanism that excludes unnecessary heat such as the shielding mirror barrel 150 and 155 shown in FIG. 13. The structure similar to the variable NA stop 160 is arranged in front of the mirror where the variable NA stop is needed, and it may synchronously change the stop when the NA is changed.

In the above-mentioned embodiment, the radiation cooling mechanism cools the side of the exposure plane of the optical member and may also cool the plane opposite the exposure plane of the optical member. In other words, if the optical member is a mirror, it may cool the plane opposite (back) the exposure plane (side irradiated by the light) of the mirror by the radiation cooling mechanism. In this case, it is preferable to locate the radiation shielding member of the above-mentioned embodiment to prevent cooling the support member that supports the optical member and other measurement equipment etc.

Figure 16:
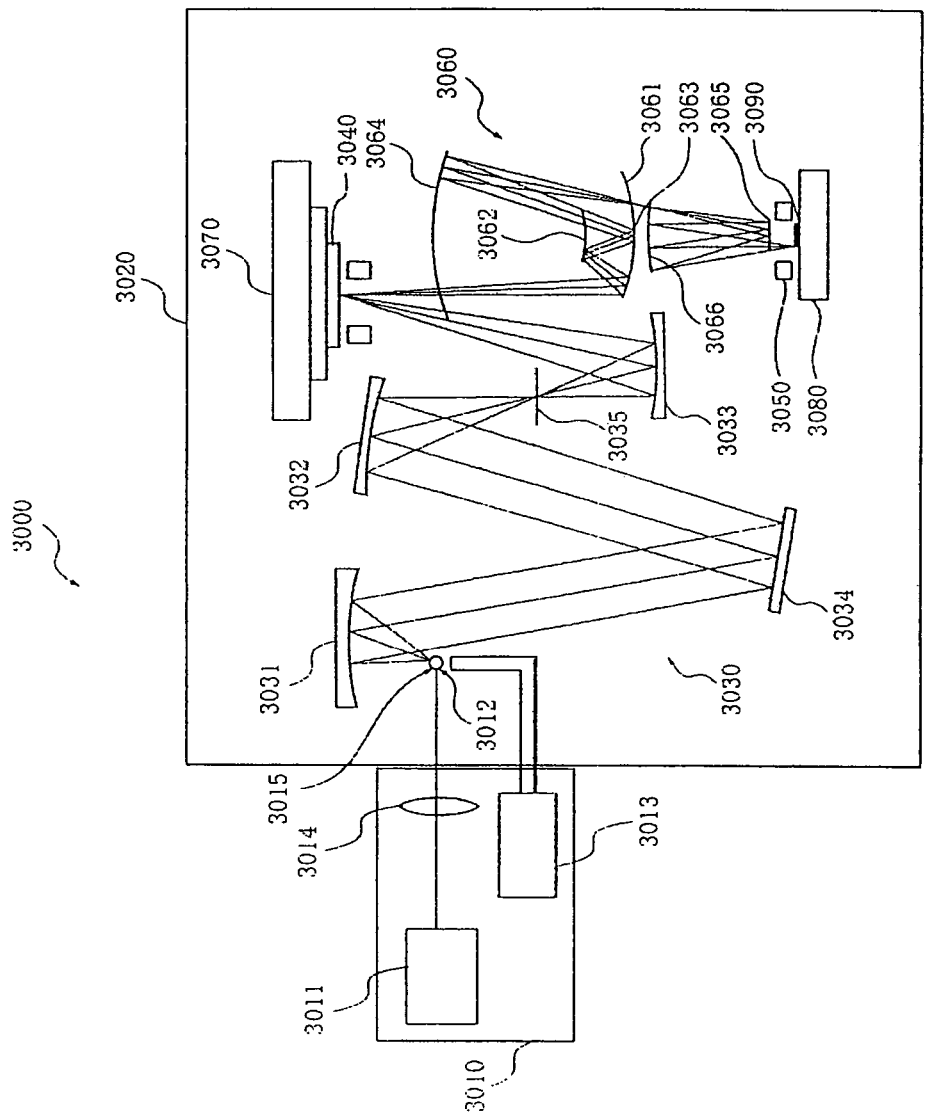
FIG. 16 is a block diagram of an illustrative exposure apparatus according to the present invention.

A description will be given of an exposure apparatus 3000 that applies the cooling mechanism 1 and 1A, the stop apparatus 100B of the present invention or those arbitrary combinations (combination of the cooling mechanism 1 and the stop 100B or combination of the cooling mechanism 1A and the stop apparatus 100B) with reference to FIG. 16. The inventive exposure apparatus 3000 uses EUV light (with a wavelength of 13-14 nm, for example, 13.5 nm). The exposure apparatus 3000 using an arc or ring shaped image plane, scans the mask and the wafer at a speed ratio corresponding to a reduction ratio, to expose the entire surface of the mask. The exposure apparatus 3000 includes an EUV light source 3010, an illumination optical system 3030, a reflection-type reticle 3040, an alignment optical system 3050, a projection optical system 3060, a reticle stage 3070, a wafer stage 3080 and a wafer 3090. An optical path through which EUV light passes is preferably maintained in vacuum atmosphere due to the low transmittance of EUV light through air. Thus, everything from the illumination optical system 3030 to the wafer stage 3080 is stored in a vacuum vessel 3020.

The EUV light source 3010 employs, for example, a laser plasma light source. The EUV light source 3010 generates high temperature plasma 3015 by irradiating a high intensity pulsed laser beam from a pulse laser 3013, through a condenser lens 3014, and onto a target material 3012 supplied by a target supply unit 3011 in the vacuum vessel 3020. The EUV light used, with a wavelength of about 13.5 nm as an example, has been emitted from the plasma 3015. The target material 3012 may use a metallic thin film, an inert gas, a liquid-drop, etc. The target supply unit 3011 may use a gas jet and so on. The pulse laser 3013 is usually driven with a higher repetitive frequency, such as several kHz, for increased average intensity of radiated EUV light. Alternatively, the EUV light source 3010 may use a discharge plasma light source, which emits gas around an electrode placed in the vacuum vessel 3020, applies pulse voltage to the electrode for discharge, and induces high-temperature plasma. This plasma emits the EUV light, for example, with a wavelength of about 13.5 nm, to be utilized.

The illumination optical system 3030 propagates the EUV light and illuminates the reticle or a mask 3040 (these terms are used interchangeably in the present application). In FIG. 16, the illumination optical system 3030 includes three mirrors (3031, 3032 and 3033), an optical integrator 3034 and an aperture 3035. The first mirror 3031 serves to collect the EUV light that is isotropically irradiated from the laser plasma 3015. The optical integrator 3034 serves to uniformly illuminate the reticle 3040 with a predetermined NA. Moreover, those EUV light is relayed to the reticle 3040 by the second and third mirrors (3032 and 3033). The aperture 3035 is for limiting the illumination area to an arc shape at a position conjugate with the reticle 3040.

Here, the three mirrors (3031, 3032 and 3033) and the optical integrator 3034 in the illumination optical system may apply the inventive cooling apparatus 1 or 1A because it is heated by the incident EUV light. Each mirror is cooled by radiation. Both the cooling apparatus 1 and 1A can be used. The one judged to be suitable after consideration of the spec of the exposure apparatus 3000, cost and permissible space is selected. Thereinafter, as an example, a description will be given using the cooling apparatus 1A. In the illumination optical system 3030 in FIG. 16, an angle of incident EUV light that is incidence in the three mirrors (3031, 3032 and 3033) and the optical integrator 3034 is comparatively small. Thus, it is difficult to arrange the radiation plate 101A at a position opposite the exposure plane. It is therefore desirable to arrange the cooling apparatus 1A in the form shown in FIGS. 7 to 9.

3060 is the projection optical system. Here, the reflection-type projection optical system shown in Japanese Laid-Open Patent Application No. 2003-45782 is enumerated as one example of the projection optical system 3060 to explain more realistically the application example to exposure apparatus 3000. The projection optical system 3060 has, in order of reflecting light from the reticle 3040 side, a first mirror 3061 (concave), a second mirror 3062 (convex), a third mirror 3063 (convex), and a fourth mirror 3064 (concave). The third mirror 3063 is located in the part of an aperture stop. The present invention serves as an optical system that has good imaging performance with high NA. The first to sixth mirrors 3061, 3062, 3063, 3064, 3065 and 3066 in the projection optical system 3060 is heated by the incident EUV light and are radiation cooled by the cooling apparatus 1 or 1A. The projection optical system 3060 can use both cooling apparatus 1 and cooling apparatus 1A, as well as illumination optical system 3030. An angle of incidence of EUV light to the first through third mirror 3061, 3062 and 3063 is comparatively big. It is thus possible to arrange the radiation plate 101A at a position opposite the exposure plane. Therefore, it is desirable to arrange the cooling apparatus 1A in the form shown in FIG. 3 to 4 or 6. An angle of incidence of EUV light from the fourth through the sixth mirrors 3064, 3065 and 3066 is comparatively small. Thus, it is difficult to arrange the radiation plate 101A at a position opposite the exposure plane. It is therefore desirable to arrange the cooling apparatus 1A in the form shown in FIG. 7 to 9.

The reticle stage 3070 and the wafer stage 3080 have a mechanism that synchronously scans at a speed ratio corresponding to a reduction ratio. Here, the exposure apparatus 3000 uses the direction X, a direction Y perpendicular to the direction X, and a direction Z perpendicular to the reticle 3040 or the wafer 3090, to scan the reticle 3040 or the wafer 3090.

The reticle 3040 with the desired pattern is maintained by a reticle chuck (not shown) on the reticle stage 3070. The reticle stage's 3070 can determine the position of the reticle 3040 because it has a mechanism that moves in the X direction; and a micrometer mechanism in the X direction, the Y direction, the Z direction, and the direction of the rotation around each axis. The positions and altitude of the reticle stage 3070 is measured by a laser interferometer which controls the position and altitude based on the measured result. In the embodiment, the reticle 3040 is a reflection-type reticle. The projection optical system 3060 can reduce an inclination of the principal ray from the reticle 3040 and can apply either a transmission-type reticle or the reflection-type reticle.

The wafer 3090 is maintained on the wafer stage 3080 by a wafer chuck (not shown). The wafer stage 3090 can determine the position of the wafer 3080 because it has a mechanism that moves in the X direction; and a micrometer mechanism in the X direction, Y direction, Z direction, and the direction of the rotation around each axis. The positions and altitude of the wafer stage 3090 is measured by a laser interferometer which controls the position and altitude based on the measured result.

The alignment optical system 3050 measures the positional relationship between the position of the reticle 3040 and the optical axis of the projection optical system 3060, and the positional relationship between the position of the wafer 3090 and the optical axis of the projection optical system 3060. It sets the positions and angles of the reticle stage 3070 and the wafer stage 3080 so that a projected image of the reticle 3040 may be positioned accurately on the wafer 3090. A focus detection optical system (not shown) measures a focus position in the Z direction on the wafer 3090 surface. Control over the position and angle of the wafer stage 3080 can always maintain the wafer 3090 surface to the imaging position of the projection optical system 3060 during exposure.

When the scanning exposure on the wafer 3090 is complete, the wafer stage 3080 moves in the X and Y directions to the beginning of the next scanning exposure position. It then scans the reticle stage 3070 and the wafer stage 3080 at the speed ratio corresponding to the reduction ratio of the projection optical system in the X direction.

Thus, synchronous scanning of the reduction projection image of the reticle 3040 onto the wafer 3090 is repeated (step and scan). The transfer pattern of the reticle 3040 is transcribed to the entire wafer 3090.

It is necessary to keep less than constant pressure between the space that the EUV light passes and the space that the optical element is located to prevent the EUV light from being absorbed by gas and attaching to molecules, including carbon, which remains in the space where the optical element, irradiated by the EUV light, is located. Therefore, the light source, the optical element of the illumination optical system 3030 and the projection optical system 3060, reticle 3040 and wafer 3090 etc., are stored in a vacuum vessel 3020 which is exhausted to vacuum atmosphere.

In exposure, the EUV light emitted from the illumination apparatus illuminates the reticle 3040 and images a pattern formed on the reticle 3040 onto the wafer 3090. The instant embodiment, using an arc or ring shaped image plane to expose the entire surface of the reticle 3040, scans the reticle 3040 and the wafer 3090 at the speed ratio corresponding to the reduction ratio.

In the instant embodiment, the light source for the exposure apparatus is not limited. For example, the light source may use a Z pinch method as a discharge method, a plasma focus, a capillary discharge, or a follower cathode trigger Z pinch.

Figure 17:
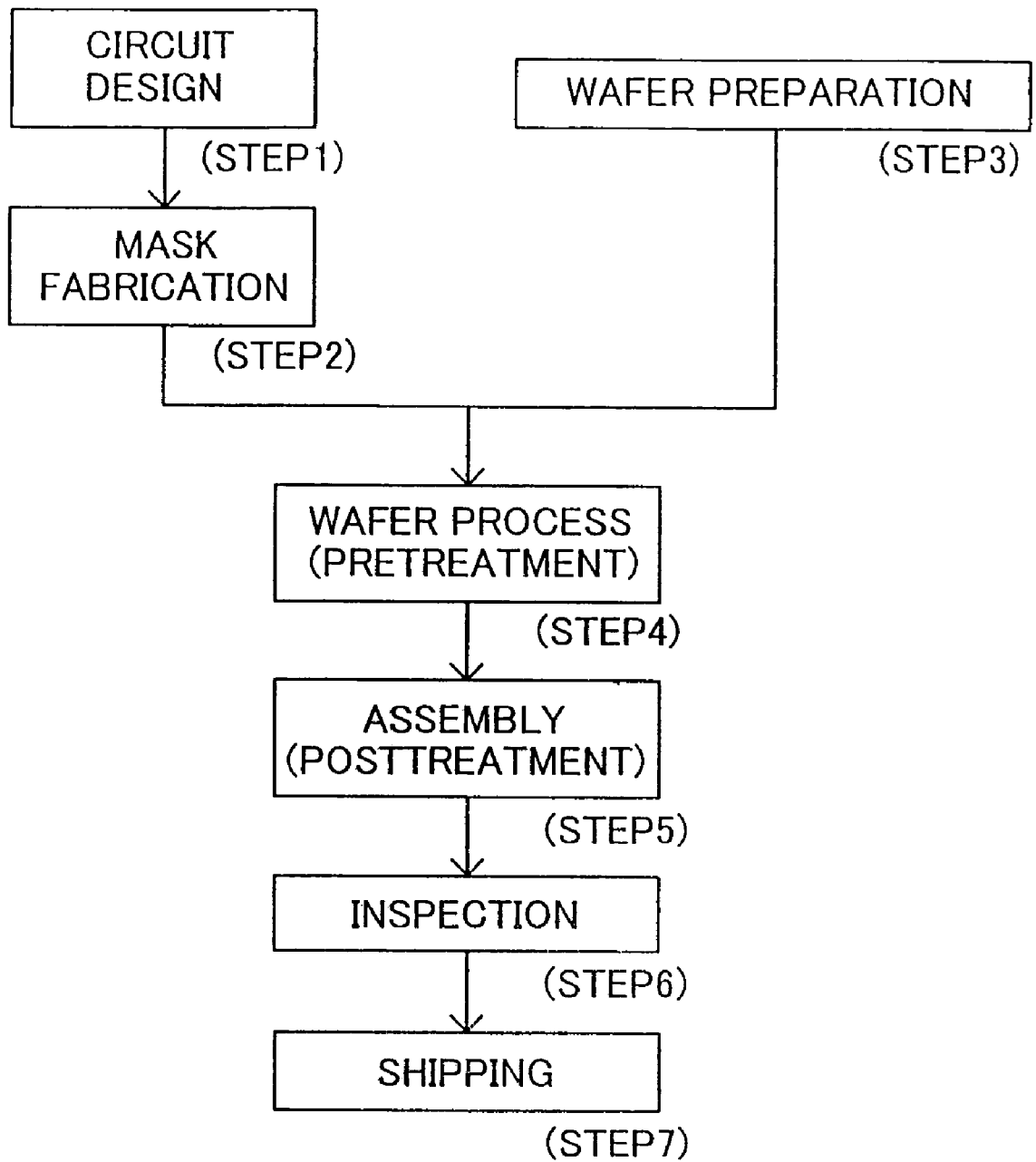
FIG. 17 is a flowchart for explaining how to fabricate devices (such as semiconductor chips such as ICs, LCDs, CCDs, and the like).
Figure 18:
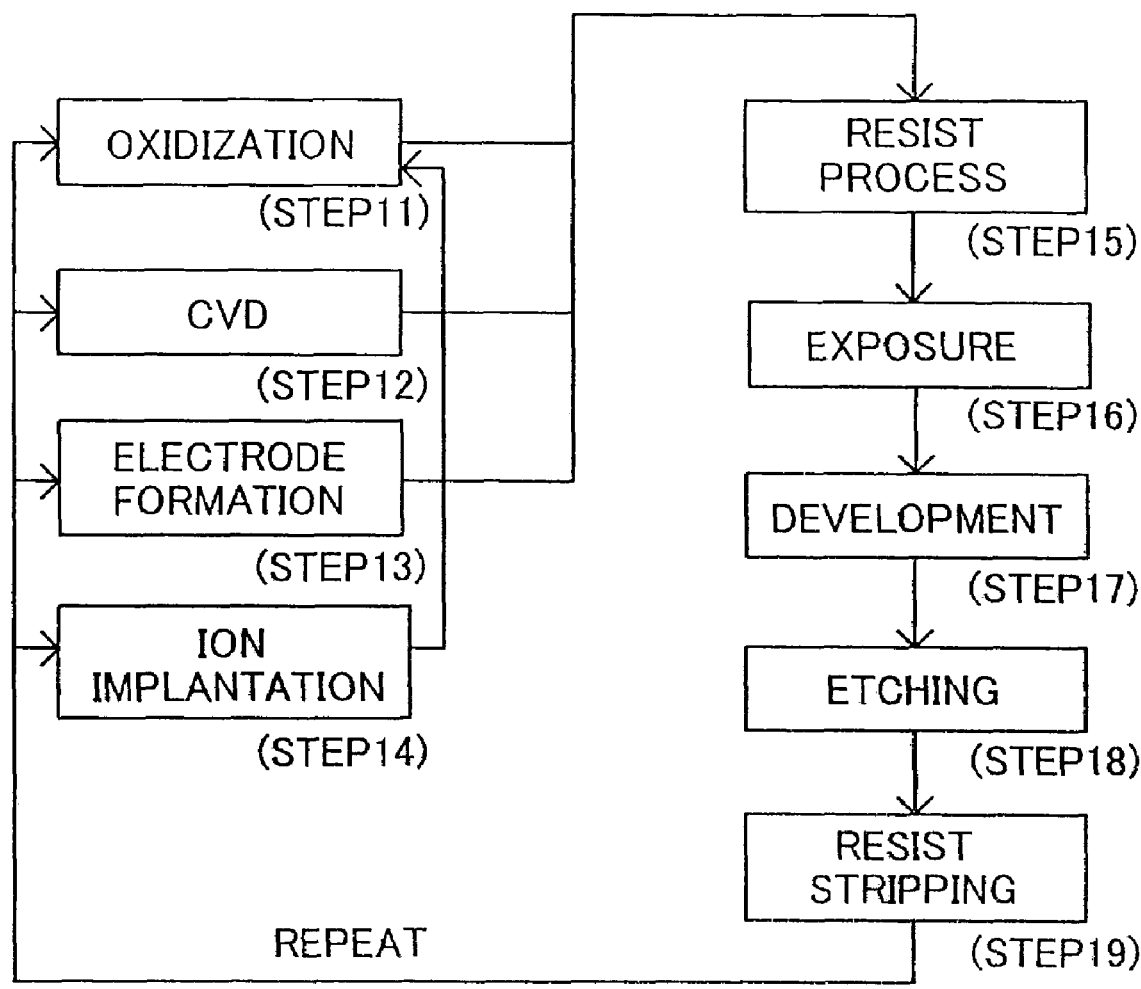
FIG. 18 is a detailed flowchart of a wafer process in Step 4 of FIG. 17.
Figure 19A:
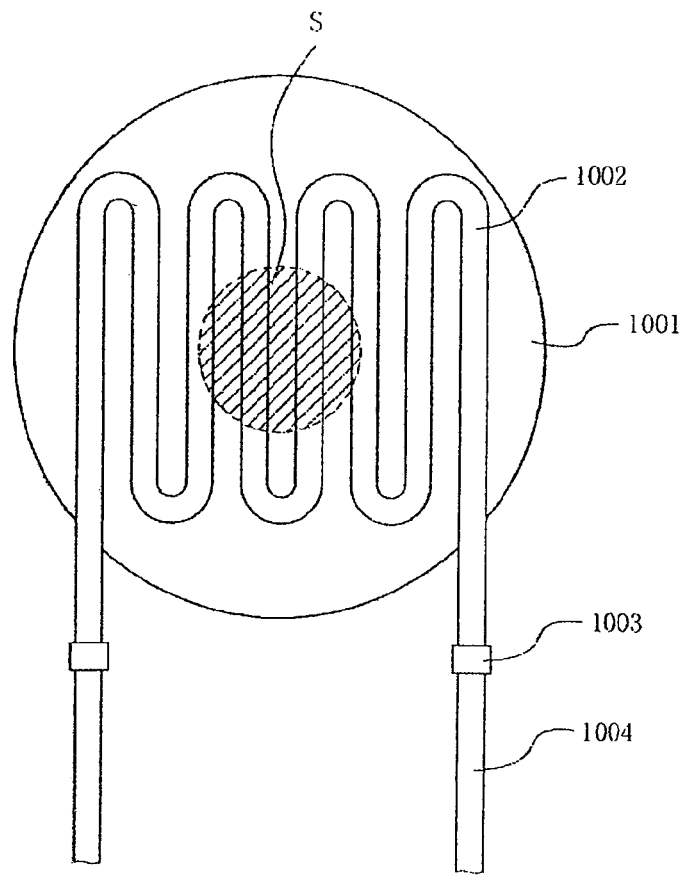
FIG. 19A is a plane view of the mirror.
Figure 19B:
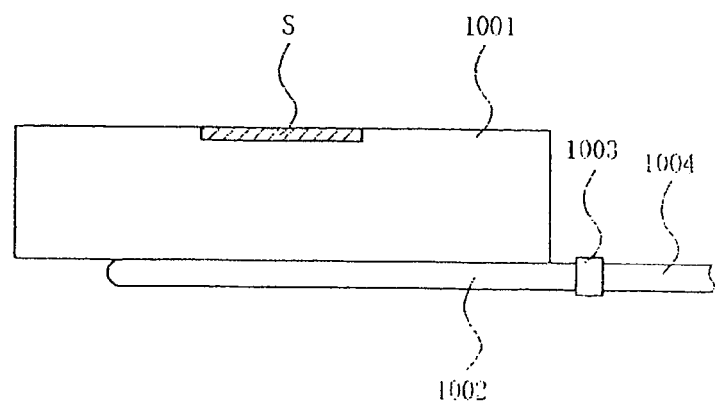
FIG. 19B is a sectional view of the mirror.

Referring now to FIGS. 17 and 18, a description will be given of an embodiment of a device fabricating method using the above exposure apparatus 3000. FIG. 17 is a flowchart for explaining a fabrication of devices (i.e., semiconductor chips such as IC and LSI, LCDs, CCDs, etc.). Here, as an example, a description will be given of a semiconductor chip fabrication. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), referred to as a pretreatment, forms the actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 18 is a detailed flowchart of the wafer process in Step 4 of FIG. 7. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 3000 to expose a circuit pattern on the mask onto the wafer. Step 17 (development) develops the exposed wafer. Step 18 (etching) etches parts other than a developed resist image. Step 19 (resist stripping) removes unused resist after etching. These steps are repeated to form multilayer circuit patterns on the wafer. The device fabrication method of this embodiment may manufacture higher quality devices than the conventional method. Thus, a device fabrication method using the exposure apparatus 3000 and resultant devices constitute one aspect of the present invention.

The example of applying the inventive cooling apparatus to the exposure apparatus was shown above. The inventive cooling apparatus is not limited to EUV light, it is applicable to excimer laser, as well as a mask and a wafer.

Thus, the inventive temperature adjustment apparatus and method may cool an optical member provided in vacuum atmosphere in a non-contact manner and provide the intended optical performance by reducing deformation of an optical element due to thermal expansion that would otherwise deteriorate imaging performance.

The embodiment of the instant example can be described as follows.

1. A temperature adjustment apparatus for adjusting temperature of an optical member, said temperature adjustment apparatus comprising:
a first radiation mechanism for adjusting the temperature by providing a radiation heat to a predetermined area of the optical member; and
a shielding member for shielding the radiation heat from the first radiation mechanism so that the radiation heat does not propagate to an area other than the predetermined area of the optical member.

2. A temperature adjustment apparatus according to embodiment 1, wherein an emissivity of the shielding member is less than 0.1 or more than 0.9.

3. A temperature adjustment apparatus according to embodiment 1, wherein the shielding member functions as a stop to limit incidence light to the optical member.

4. A temperature adjustment apparatus according to embodiment 1, wherein the shielding member is cylinder shape.

5. A temperature adjustment apparatus according to embodiment 1, further comprising a temperature adjustment part for adjusting the temperature of the shielding member.

6. A temperature adjustment apparatus according to embodiment 1, wherein the predetermined area of the optical member almost corresponds to an area where light is irradiated to the optical member (exposure area S).

7. A temperature adjustment apparatus according to embodiment 1, wherein the optical member and the shielding member are supported by mutually different support members.

8. A temperature adjustment apparatus according to embodiment 1, wherein the optical member is a reflection member, and
the first radiation mechanism provides the radiation heat to a reflecting plane (surface) of the optical member.

9. A temperature adjustment apparatus according to embodiment 1, wherein the optical member is a reflection member, and
the first radiation mechanism is opposite a reflecting plane (surface) of the optical member.

10. A temperature adjustment apparatus according to embodiment 1, wherein the optical member is a reflection member, and
the first radiation mechanism includes a first radiation plate that is opposite to a reflecting plane (surface) of the optical member, and provides the radiation heat to the reflecting plane from the first radiation plate.

11. A temperature adjustment apparatus according to embodiment 1, wherein the first radiation mechanism includes a first radiation plate for adjusting the temperature of the optical member, and
the first radiation plate has a shape almost similar to at least a part of a conic side, at least a part of a pyramid side or a part of ball.

12. A temperature adjustment apparatus according to embodiment 1, wherein the first radiation mechanism includes a radiation plate for adjusting the temperature of the optical member,
a radiation plane of the radiation plate that is opposite to the predetermined area, has a concave shape,
a radius of curvature of the radiation plane is the same as a distance of a center of the radiation plane and a center of the predetermined area or longer than the distance of the center of the radiation plane and the center of the predetermined area.

13. A temperature adjustment apparatus according to embodiment 1, wherein the optical member is a reflection member further comprising a second radiation mechanism for providing the radiation heat to the other side of a reflection plane (back surface) of the reflection member.

14. A temperature adjustment apparatus according to embodiment 1, wherein the optical member is a reflection member,
further comprising a second radiation mechanism opposite another side of a reflection plane (back surface) of the reflection member.

15. A temperature adjustment apparatus according to embodiment 1, wherein the optical member is a reflection member,
further comprising a second radiation mechanism with a second radiation plate that is on a side opposite a reflection plane (back surface) of the reflection member, for providing the radiation heat to the other side of the reflection plane from the second radiation plate (second radiation member).

16. A temperature adjustment apparatus according to embodiment 1, wherein the shielding member is designed to cover at least a periphery part of the optical member.

17. A temperature adjustment apparatus according to embodiment 1, wherein the shielding member is designed to cover a periphery of the optical member that is an area different from an optical path of incidence light to the optical member and emission light from the optical member.

18. An exposure apparatus that exposes an object using a pattern on a mask, said exposure apparatus comprising:
a temperature adjustment apparatus for adjusting a temperature of an optical member,
wherein the temperature adjustment apparatus includes:
a first radiation mechanism for adjusting the temperature by providing radiation heat to a predetermined area of the optical member; and
a shielding member for shielding the radiation heat from the first radiation mechanism so that the radiation heat does not propagate to an area other than the predetermined area of the optical member.

19. A device fabrication method comprising the step of:
exposing an object using an exposure apparatus; and
performing a development process for the object exposed,
wherein the exposure apparatus includes:
a temperature adjustment apparatus for adjusting a temperature of an optical member,
wherein the temperature adjustment apparatus includes:
a first radiation mechanism for adjusting the temperature by providing radiation heat to a predetermined area of the optical member; and
a shielding member for shielding the radiation heat from the first radiation mechanism so that the radiation heat does not propagate to an area other than the predetermined area of the optical member.

20. An exposure apparatus comprising:
an illumination optical system for illuminating a pattern of a mask using light from a light source,
a projection optical system for projecting light from the pattern onto an object; and
a temperature adjustment apparatus for adjusting a temperature of at least one optical member that is included in the illumination optical system and the projection optical system,
wherein the temperature adjustment apparatus includes:
a first radiation mechanism for adjusting the temperature by providing radiation heat to a predetermined area of the optical member; and a shielding member for shielding the radiation heat from the first radiation mechanism so that the radiation heat does not propagate to an area other than the predetermined area of the optical member.

21. A device fabrication method comprising the step of:
exposing an object using an exposure apparatus; and
performing a development process on the object exposed,
wherein the exposure apparatus includes:
an illumination optical system for illuminating a pattern of a mask using light from a light source,
a projection optical system for projecting light from the pattern onto the object,
a temperature adjustment apparatus for adjusting a temperature of at least one optical member that is included in the illumination optical system and the projection optical system,
wherein the temperature adjustment apparatus includes:
a first radiation mechanism for adjusting the temperature by providing radiation heat to a predetermined area of the optical member; and
a shielding member for shielding the radiation heat from the first radiation mechanism so that the radiation heat does not propagate to an area other than the predetermined area of the optical member.

22. A temperature adjustment (cooling) apparatus for adjusting temperature of (cooling) an optical member located in vacuum atmosphere, the temperature adjustment comprising:
a detector part with an optical member temperature detector that detects temperature of the optical member,
a radiation temperature adjusting (cooling) mechanism, arranged apart from the optical member, for absorbing heat from an exposure area of the optical member by radiation,
a radiation shielding member for shielding radiation heat transferred from the radiation temperature adjusting (cooling) mechanism to an area other than the exposure area of the optical member; and
a controller for controlling the radiation temperature adjusting (cooling) mechanism so that the temperature detected by the detector may be a predetermined value.

23. A temperature adjustment (cooling) apparatus according to embodiment 22, wherein the radiation temperature adjusting (cooling) mechanism includes:
a channel for a cooling medium to flow through,
a radiation plate forming a temperature difference with the exposure area of the optical member; and
a circulation part, controlled by the controller, for making the cooling medium circulate to the channel.

24. A temperature adjustment (cooling) apparatus according to embodiment 23, wherein temperature of the cooling medium is changeable.

25. A temperature adjustment (cooling) apparatus according to embodiment 22, wherein the radiation temperature adjusting (cooling) mechanism includes:
a radiation plate forming a temperature difference with the optical member,
a Peltier element, controlled by the controller and coupled with the radiation plate, for adjusting temperature of (cooling) the radiation plate using a Peltier effect,
a radiator block that includes a channel for a cooling medium to flow through and draw heat from the Peltier element; and
a circulation part for making the cooling medium circulate to the channel.

26. A temperature adjustment (cooling) apparatus according to embodiment 25, wherein temperature of the cooling medium is set to be substantially constant.

27. A temperature adjustment (cooling) apparatus according to embodiment 23, wherein the radiation plate, arranged apart from the optical member and near the optical path of the exposure light, has a shape where radiation mode coefficient with the exposure area of the optical member approaches almost 1 (more than 0.9).

28. A temperature adjustment (cooling) apparatus according to embodiment 22, further comprising:
a channel for a cooling medium to flow through,
a circulation part, controlled by the controller, for making the cooling medium circulate to the channel.

29. A temperature adjustment (cooling) apparatus according to embodiment 28, wherein the detector part includes a radiation shielding member temperature detector that detects the radiation shielding member,
the temperature of the radiation shielding member detected by the radiation shielding member temperature detector is equal to the temperature of the optical member detected by optical member temperature detector and cooled by the temperature of the cooling medium controlled by the controller.

30. A temperature adjustment (cooling) apparatus according to embodiment 22, wherein emissivity of the inside surface of the radiation shielding member is almost 1.

31. A temperature adjustment (cooling) apparatus according to embodiment 22, wherein the radiation shielding member includes a radiation shielding stop that shields radiation heat transfer between the radiation plate and areas other than the exposure area of the optical member in an open part of the radiation shielding member.

32. A temperature adjustment (cooling) apparatus according to embodiment 31, wherein the radiation shielding stop has a configurable shape to correspond to the exposure area of the optical member.

33. A temperature adjustment (cooling) apparatus according to embodiment 25, wherein the detector part includes a temperature distribution detector that detects an exposure plane temperature distribution of the optical member.

34. A temperature adjustment (cooling) apparatus according to embodiment 33, wherein the radiation temperature adjusting (cooling) mechanism coupled with the radiation plate, includes a plurality of the Peltier elements individually controlled by the controller so that the exposure plane temperature distribution of the optical member detected by the temperature distribution detector may be uniform and constant.

35. A temperature adjustment (cooling) apparatus according to embodiment 33, wherein the temperature distribution detector detects the exposure plane temperature distribution of the optical member without contacting the optical member.

36. A temperature adjustment (cooling) apparatus according to embodiment 35, wherein the controller corrects a value detected by the temperature distribution detector to a value detected by the optical member temperature detector.

37. A temperature adjustment (cooling) apparatus according to embodiment 33, wherein the radiation plate has low heat conductivity.

38. A method for adjusting temperature of (cooling) an optical member located in a vacuum atmosphere, the method comprising the steps of:
detecting temperature of the optical member; and
forming a temperature difference between the optical member and a radiation plate that is arranged apart from the optical member and absorbs heat of exposure area of the optical member, so that temperature of exposure area of the optical member detected by detecting step may be a predetermined value.

39. An exposure apparatus comprising:
a temperature adjustment (cooling) apparatus for adjusting temperature of (cooling) an optical member located in a vacuum atmosphere; and
an optical system that exposes an object using a pattern on a mask or reticle via the optical element that adjusted temperature (cooled) by the temperature adjustment (cooling) apparatus,
wherein the temperature adjustment includes:
a detector part that includes the optical member temperature detector that detects temperature of the optical member,
a radiation temperature adjusting (cooling) mechanism, arranged apart from the optical member, for absorbing a heat from an exposure area of the optical member by radiation,
a radiation shielding member for shielding radiation heat transfer from the radiation temperature adjusting (cooling) mechanism to an area other than the exposure area of the optical member; and
a controller for controlling the radiation temperature adjusting (cooling) mechanism so that the temperature detected by the detector may be a predetermined value.

40. A device fabrication method comprising the step of:
exposing an object using an exposure apparatus; and
performing a development process for the object exposed,
wherein the exposure apparatus includes:
a temperature adjustment (cooling) apparatus for adjusting temperature of (cooling) an optical member located in a vacuum atmosphere; and
an optical system that exposes an object using a pattern on a mask or reticle via the optical element that adjusted temperature (cooled) by the temperature adjustment (cooling) apparatus,
wherein the temperature adjustment includes:
a detector part that includes the optical member temperature detector that detects temperature of the optical member,
a radiation temperature adjusting (cooling) mechanism, arranged apart from the optical member, for absorbing heat from an exposure area of the optical member by radiation,
a radiation shielding member for shielding radiation heat transfer from the radiation temperature adjusting (cooling) mechanism to an area other than the exposure area of the optical member; and
a controller for controlling the radiation temperature adjusting (cooling) mechanism so that the temperature detected by the detector may be a predetermined value.

41. A stop apparatus comprising:
a stop, arranged at an incidence side of an optical element for limiting exposure light,
wherein the emissivity of the stop is less than 0.1 or more than 0.9.

42. A stop apparatus according to embodiment 41, wherein the stop covers periphery of the optical element.

43. A stop apparatus according to embodiment 41, wherein the stop limits aperture of exposure light.

44. A stop apparatus according to embodiment 41, further comprising a temperature adjustment (cooling) apparatus.

45. A stop apparatus according to embodiment 44, wherein the temperature adjustment (cooling) apparatus includes:
a Peltier element, coupled with the stop, for adjusting temperature of (cooling) the stop using a Peltier effect; and
a channel for a cooling medium to flow through,
wherein the channel draws heat from the Peltier element.

46. A stop apparatus according to embodiment 41, wherein the optical element is a mirror.

47. An exposure apparatus comprising:
an illumination optical system for illuminating a pattern of a mask (reticle) using light from a light source,
a projection optical system for projecting light from the pattern onto an object; and
a stop apparatus includes a stop, arranged at an incidence side of an optical element of either the illumination optical system or the projection optical system, for limiting exposure light,
wherein the emissivity of the stop is less than 0.1 or more than 0.9.

48. An exposure apparatus according to embodiment 47, wherein light used in the exposure apparatus is EUV light.

49. An exposure apparatus according to embodiment 47, wherein atmosphere of an optical path that passes exposure light is high vacuum or filled with helium gas.

50. A device fabrication method comprising the steps of:
exposing an object using an exposure apparatus; and
performing a development process for the object exposed,
wherein the exposure apparatus includes:
an illumination optical system for illuminating a pattern of a mask (reticle) using light from a light source,
a projection optical system for projecting light from the pattern onto an object; and
a stop apparatus includes a stop, arranged at an incidence side of an optical element of either the illumination optical system or the projection optical system, for limiting exposure light,
wherein the emissivity of the stop is less than 0.1 or more than 0.9.

51. An exposure apparatus comprising:
a stop, arranged at an incidence side of an optical element for limiting exposure light,
an optical system that exposes an object using a pattern on a mask or reticle via an opening of the stop,
wherein the emissivity of the stop is less than 0.1 or more than 0.9.

52. An exposure apparatus according to embodiment 51, wherein light used in the exposure apparatus is EUV light.

53. An exposure apparatus according to embodiment 51, wherein atmosphere of an optical path that passes exposure light is vacuum or filled with helium gas.

54. A device fabrication method comprising the steps of:
exposing an object using an exposure apparatus; and
performing a development process for the object exposed,
wherein the exposure apparatus includes:
a stop, arranged at an incidence side of an optical element for limiting exposure light,
an optical system that exposes an object using a pattern on a mask or reticle via an opening of the stop,
wherein the emissivity of the stop is less than 0.1 or more than 0.9.

55. A temperature adjustment apparatus for adjusting temperature of an optical member, the temperature adjustment apparatus comprising:
a first radiation mechanism which includes a first radiation member to transfer radiation heat between a predetermined area of the optical member, for adjusting temperature of the optical member by the first radiation member; and a shielding member for reducing an amount of radiation heat that transfer to an area other than the determined area among the radiation heat from the first radiation member.

56. A temperature adjustment apparatus according to embodiment 55, wherein the emissivity of the shielding member is less than 0.1 or more than 0.9.

57. A temperature adjustment apparatus according to embodiment 55, wherein the shielding member functions as a stop to limit incidence light to the optical member.

58. A temperature adjustment apparatus according to embodiment 55, wherein the shielding member is cylinder shape where a side of a space between the optical member and the first radiation member is covered.

59. A temperature adjustment apparatus according to embodiment 55, further comprising a temperature adjustment mechanism for adjusting a temperature of the shielding member.

60. A temperature adjustment apparatus according to embodiment 55, wherein the optical member and the shielding member are supported by mutually different support members.

61. A temperature adjustment apparatus according to embodiment 55, wherein the optical member is a reflection member, and
the first radiation mechanism is opposite a reflection plane of the optical member.

62. A temperature adjustment apparatus according to embodiment 55,
wherein a radiation plane of the first radiation plate that is opposite to the predetermined area has a concave shape, and
a radius of curvature of the radiation plane is the same as the distance of the center of the radiation plane and the center of the predetermined area or longer than the distance of the center of the radiation plane and the center of the predetermined area.

63. A temperature adjustment apparatus according to embodiment 61, further comprising a second radiation mechanism with a second radiation member that is opposite the side of the reflection plane of the reflection member, for adjusting the temperature of the optical member by the second radiation member.

64. A temperature adjustment apparatus according to embodiment 55, wherein the shielding member is designed to cover at least a periphery part of the optical member.

65. A temperature adjustment apparatus according to embodiment 55, further comprising:
a temperature detector for detecting a temperature of the optical member; and
a controller for controlling the first radiation mechanism based on the detection result from the temperature detector.

66. A temperature adjustment apparatus according to embodiment 55, further comprising a channel for a cooling medium to flow through and adjust temperature of the first radiation member.

67. A temperature adjustment apparatus according to embodiment 55, further comprising:
a Peltier element located on the other side of the optical member of the first radiation member,
a radiator block located on the other side of the Peltier element and the first radiation member; and a controller for adjusting the temperature of the first radiation member by adjusting current through the Peltier element.

68. A temperature adjustment apparatus according to embodiment 67, further comprising a channel located in the radiator block for a cooling medium to flow through and to keep the temperature of the radiator block substantially constant.

69. A temperature adjustment apparatus according to embodiment 55, wherein the shielding member prevents the radiation heat from transferring to an area other than the determined area among the radiation heat from the first radiation member.

70. An exposure apparatus comprising:
an optical system which includes an optical member and leads a light from a light source to an object,
a first radiation mechanism with a first radiation member that transfers the radiation heat between a predetermined area of the optical member, for adjusting the temperature of the optical member by the first radiation member; and
a shielding member for reducing an amount of radiation heat transferred to an area other than the determined area among the radiation heat from the first radiation member.

71. An exposure apparatus according to embodiment 70, wherein the light from the light source is EUV light,
an optical element arranged on an optical path from the light source to the object is all reflection-type optical element,
atmosphere of a space where the optical member is stored is vacuum or filled with helium gas.

72. An exposure apparatus according to embodiment 70, wherein the shielding member prevents radiation heat transfer to an area other than the determined area among the radiation heat from the first radiation member.

73. A device fabrication method comprising the steps of:
exposing an object using an exposure apparatus; and
performing a development process for the object exposed,
wherein the exposure apparatus includes:
an optical system with an optical member and leads a light from a light source to an object,
a first radiation mechanism with a first radiation member to transfer the radiation heat between a predetermined area of the optical member and for adjusting the temperature of the optical member by the first radiation member; and
a shielding member for reducing radiation heat transfers to an area other than the determined area among the radiation heat from the first radiation member.

74. A stop apparatus comprising:
a stop, arranged at an incidence side of an optical member, for limiting incidence light to the optical member,
wherein the emissivity of the stop is less than 0.1 or more than 0.9.

75. An exposure apparatus comprising:
an optical system with an optical member to lead a light from a light source to an object,
a stop, arranged at an incidence side of the optical member for limiting incidence light to the optical member,
wherein the emissivity of the stop is less than 0.1 or more than 0.9.

76. A device fabrication method comprising the steps of:
exposing an object using an exposure apparatus; and
performing a development process for the object exposed, wherein the exposure apparatus includes:
an optical system, with an optical member, for leading light from a light source to an object,
a stop, arranged at an incidence side of the optical member for limiting incidence light to the optical member,
wherein the emissivity of the stop is less than 0.1 or more than 0.9.

77. An exposure apparatus comprising:
an optical system, with an optical member, for leading light from a light source to an object,
a first radiation mechanism with a first radiation member that transfers the radiation heat between a predetermined area of the optical member, for adjusting the temperature of the optical member by the first radiation member,
a shielding member for reducing radiation heat transfers to an area other than the determined area among the radiation heat from the first radiation member,
a temperature detector mechanism for detecting a temperature of the optical member; and
a controller mechanism for controlling the first radiation mechanism based on the detection result from the temperature detector mechanism.

78. An exposure apparatus according to embodiment 77, wherein the controller mechanism adjusts the temperature of the optical member based on the detection result and an exposure schedule that exposes object.

79. An exposure apparatus according to embodiment 77, further comprising;
a Peltier element located on the other side of the optical member of the first radiation member,
a radiator block located on the other side of the Peltier element and the first radiation member,
a channel located in the radiator block for a cooling medium to flow through to keep the temperature of the radiator block substantially constant, and
a controller for adjusting the temperature of the first radiation member by adjusting current through the Peltier element.

80. A device fabrication method comprising the steps of:
exposing an object using an exposure apparatus; and
performing a development process for the object exposed,
wherein the exposure apparatus includes:
an optical system, with an optical member, for leading light from a light source to an object,
a first radiation mechanism with a first radiation member that transfers the radiation heat between a predetermined area of the optical member, for adjusting the temperature of the optical member by the first radiation member,
a shielding member for reducing radiation heat transfers to an area other than the determined area among the radiation heat from the first radiation member,
a temperature detector mechanism for detecting a temperature of the optical member; and
a controller mechanism for controlling the first radiation mechanism based on the detection result from the temperature detector mechanism.

What is claimed is:

1. An exposure apparatus for exposing a substrate to extreme ultraviolet light via a reticle, said apparatus comprising:
a mirror arranged in a path of the light and configured to direct the light;
a radiation member configured to radiate heat to a reflective area of said mirror;
a shielding member configured to shield heat radiation which travels from said radiation member toward an area different from the reflective area;
a first detector configured to detect temperature of said mirror;
a cooling mechanism configured to cool said radiation member based on detection performed by said first detector;
a second detector configured to detect temperature of said shielding member; and
a temperature adjustment mechanism configured to adjust temperature of said shielding member based on detection performed by said second detector so that temperature of said shielding member is substantially equal to target temperature of said mirror.

2. An apparatus according to claim 1, wherein emissivity of said shielding member is less than 0.1 or more than 0.9.

3. An apparatus according to claim 1, wherein said shielding member is configured as a stop for limiting light incident on said mirror.

4. An apparatus according to claim 1, wherein said shielding member has a cylindrical shape to cover a space between said mirror and said radiation member.

5. An apparatus according to claim 1, further comprising a support member configured to support said shielding member independently of said mirror.

6. An apparatus according to claim 1, wherein said radiation member is configured to face the reflective area of said mirror.

7. An apparatus according to claim 1, wherein
a radiation surface of said radiation member has a shape concave toward the reflective area, and
a curvature radius of the radiation surface is not shorter than a distance between a center of radiation surface and a center of the reflective area.

8. An apparatus according to claim 1, wherein said shielding member is configured to cover a periphery of said mirror.

9. An apparatus according to claim 1, wherein said cooling mechanism includes a channel for a cooling medium.

10. An apparatus according to claim 1, wherein said cooling mechanism includes a Peltier element configured to cool said radiation member.

11. An apparatus according to claim 10, further comprising a radiator block for said Peltier element, and a channel for a cooling medium to flow through said radiator block.

12. An apparatus according to claim 1, further comprising a vacuum chamber in which said mirror is arranged.

13. An apparatus according to claim 1, wherein said cooling mechanism is configured to cool said radiation member further based on an exposure schedule to be performed by said apparatus.

14. A method of fabricating a device, said method comprising steps of:
exposing a substrate to extreme ultraviolet light via a reticle using an exposure apparatus as defined in claim 1;
developing the exposed substrate; and
processing the developed substrate to fabricate the device.

* * * * *

UNITED STATES PATENT AND TRADEMARK OFFICE
CERTIFICATE OF CORRECTION

| | |
|---|---|
| PATENT NO. | : 7,250,616 B2 |
| APPLICATION NO. | : 11/337023 |
| DATED | : July 31, 2007 |
| INVENTOR(S) | : Masanori Honda et al. |

It is certified that error appears in the above-identified patent and that said Letters Patent is hereby corrected as shown below:

Column 17, Line 33, change "(multiplicity pyramid) of course," to --(multiplicity pyramid). Of course,--.

Signed and Sealed this

First Day of April, 2008

JON W. DUDAS
*Director of the United States Patent and Trademark Office*